United States Patent
Shokrollahi et al.

(10) Patent No.: US 10,666,297 B2
(45) Date of Patent: May 26, 2020

(54) PIPELINED FORWARD ERROR CORRECTION FOR VECTOR SIGNALING CODE CHANNEL

(71) Applicant: Kandou Labs, S.A., Lausanne (CH)

(72) Inventors: Amin Shokrollahi, Préverenges (CH); Dario Carnelli, Saint-Prex (CH)

(73) Assignee: KANDOU LABS, S.A., Lausanne (CH)

( * ) Notice: Subject to any disclaimer, the term of this patent is extended or adjusted under 35 U.S.C. 154(b) by 89 days.

(21) Appl. No.: 15/954,138

(22) Filed: Apr. 16, 2018

(65) Prior Publication Data
US 2018/0302106 A1    Oct. 18, 2018

Related U.S. Application Data

(60) Provisional application No. 62/485,677, filed on Apr. 14, 2017.

(51) Int. Cl.
*H03M 13/15* (2006.01)
*H03M 13/00* (2006.01)
(Continued)

(52) U.S. Cl.
CPC ..... *H03M 13/1575* (2013.01); *H03M 13/091* (2013.01); *H03M 13/3746* (2013.01);
(Continued)

(58) Field of Classification Search
CPC ........... H03M 13/1575; H03M 13/616; H03M 13/6561; H03M 13/3746; H03M 13/091; H04L 1/0045; H04L 1/0061
(Continued)

(56) References Cited

U.S. PATENT DOCUMENTS 3,196,351 A    7/1965   David
3,965,418 A    6/1976   Bauer et al.
(Continued)

FOREIGN PATENT DOCUMENTS

CN    1671092 A    9/2005
CN    1864346 A    11/2006
(Continued)

OTHER PUBLICATIONS

Abbasfar, Aliazam , "Generalized Differential Vector Signaling", IEEE International Conference on Communications, ICC '09, Jun. 14, 2009, 1-5 (5 pages).
(Continued)

*Primary Examiner* — James C Kerveros
(74) *Attorney, Agent, or Firm* — Invention Mine LLC

(57) ABSTRACT

Decoding sequentially received vector signaling codewords to obtain sequential sets of data bits, wherein elements of each vector signaling codeword are received in parallel over a plurality of wires, generating an incremental update of a plurality of error correction syndrome values based on each sequential set of data bits according to a check matrix, and upon decoding of a final vector signaling codeword, performing a final incremental update of the plurality of error correction syndrome values and responsively modifying data bits within the sequential sets of data bits by selecting a set of data bits from the sequential sets of data bits according to a symbol position index determined from the plurality of error correction syndrome values, the selected set of data bits altered according to a bit error mask determined from a first error correction syndrome value of the plurality of error correction syndrome values.

20 Claims, 10 Drawing Sheets

(51) Int. Cl.
*H04L 1/00* (2006.01)
*H03M 13/37* (2006.01)
*H03M 13/09* (2006.01)

(52) U.S. Cl.
CPC ..... *H03M 13/616* (2013.01); *H03M 13/6561* (2013.01); *H04L 1/0045* (2013.01); *H04L 1/0061* (2013.01)

(58) Field of Classification Search
USPC .......................................................... 714/776
See application file for complete search history.

(56) References Cited

U.S. PATENT DOCUMENTS

| | | | |
|---|---|---|---|
| 3,970,795 A | 7/1976 | Allen | |
| 4,112,264 A | 9/1978 | Abramson et al. | |
| 4,163,258 A | 7/1979 | Ebihara et al. | |
| 4,486,739 A | 12/1984 | Franaszek et al. | |
| 4,499,550 A | 2/1985 | Ray et al. | |
| 4,772,845 A | 9/1988 | Scott | |
| 4,864,303 A | 9/1989 | Ofek | |
| 5,053,974 A | 10/1991 | Penz | |
| 5,166,956 A | 11/1992 | Baltus et al. | |
| 5,168,509 A * | 12/1992 | Nakamura | H03M 13/151 375/244 |
| 5,311,516 A | 5/1994 | Kuznicki et al. | |
| 5,331,320 A | 7/1994 | Cideciyan et al. | |
| 5,412,689 A | 5/1995 | Chan et al. | |
| 5,449,895 A | 9/1995 | Hecht et al. | |
| 5,553,097 A | 9/1996 | Dagher | |
| 5,566,193 A | 10/1996 | Cloonan | |
| 5,825,808 A | 10/1998 | Hershey et al. | |
| 5,856,935 A | 1/1999 | Moy et al. | |
| 5,875,202 A | 2/1999 | Venters et al. | |
| 5,881,130 A | 3/1999 | Zhang | |
| 5,982,954 A | 11/1999 | Delen et al. | |
| 6,005,895 A | 12/1999 | Perino et al. | |
| 6,084,883 A | 7/2000 | Norrell et al. | |
| 6,084,958 A | 7/2000 | Blossom | |
| 6,097,732 A | 8/2000 | Jung | |
| 6,119,263 A | 9/2000 | Mowbray et al. | |
| 6,128,330 A | 10/2000 | Schilling | |
| 6,154,498 A | 11/2000 | Dabral et al. | |
| 6,175,230 B1 | 1/2001 | Hamblin et al. | |
| 6,188,497 B1 | 2/2001 | Franck et al. | |
| 6,226,330 B1 | 5/2001 | Mansur | |
| 6,278,740 B1 | 8/2001 | Nordyke | |
| 6,317,465 B1 | 11/2001 | Akamatsu et al. | |
| 6,359,931 B1 | 3/2002 | Perino et al. | |
| 6,404,820 B1 | 6/2002 | Postol | |
| 6,452,420 B1 | 9/2002 | Livong | |
| 6,473,877 B1 | 10/2002 | Sharma | |
| 6,483,828 B1 | 11/2002 | Balachandran et al. | |
| 6,504,875 B2 | 1/2003 | Perino et al. | |
| 6,556,628 B1 | 4/2003 | Poulton et al. | |
| 6,621,427 B2 | 9/2003 | Greenstreet | |
| 6,621,945 B2 | 9/2003 | Bissessur | |
| 6,650,638 B1 | 11/2003 | Walker et al. | |
| 6,661,355 B2 | 12/2003 | Cornelius et al. | |
| 6,690,739 B1 | 2/2004 | Mui | |
| 6,766,342 B2 | 7/2004 | Kechriotis | |
| 6,865,234 B1 | 3/2005 | Agazzi | |
| 6,865,236 B1 | 3/2005 | Terry | |
| 6,876,317 B2 | 4/2005 | Sankaran | |
| 6,898,724 B2 | 5/2005 | Chang | |
| 6,954,492 B1 | 10/2005 | Williams | |
| 6,963,622 B2 | 11/2005 | Eroz et al. | |
| 6,973,613 B2 | 12/2005 | Cypher | |
| 6,976,194 B2 | 12/2005 | Cypher | |
| 6,982,954 B2 | 1/2006 | Dhong et al. | |
| 6,990,138 B2 | 1/2006 | Bejjani et al. | |
| 6,999,516 B1 | 2/2006 | Rajan | |
| 7,023,817 B2 | 4/2006 | Kuffner et al. | |
| 7,039,136 B2 | 5/2006 | Olson et al. | |
| 7,075,996 B2 | 7/2006 | Simon et al. | |
| 7,080,288 B2 | 7/2006 | Ferraiolo et al. | |
| 7,082,557 B2 | 7/2006 | Schauer et al. | |
| 7,127,003 B2 | 10/2006 | Rajan et al. | |
| 7,142,612 B2 | 11/2006 | Horowitz et al. | |
| 7,167,523 B2 | 1/2007 | Mansur | |
| 7,180,949 B2 | 2/2007 | Kleveland et al. | |
| 7,184,483 B2 | 2/2007 | Rajan | |
| 7,231,558 B2 | 6/2007 | Gentieu et al. | |
| 7,269,130 B2 | 9/2007 | Pitio | |
| 7,269,212 B1 | 9/2007 | Chau et al. | |
| 7,335,976 B2 | 2/2008 | Chen et al. | |
| 7,346,819 B2 | 3/2008 | Bansal et al. | |
| 7,356,213 B1 | 4/2008 | Cunningham et al. | |
| 7,358,869 B1 | 4/2008 | Chiarulli et al. | |
| 7,362,130 B2 | 4/2008 | Broyde et al. | |
| 7,362,697 B2 | 4/2008 | Becker et al. | |
| 7,370,264 B2 | 5/2008 | Worley et al. | |
| 7,633,850 B2 | 12/2009 | Ahn | |
| 7,643,588 B2 | 1/2010 | Visalli et al. | |
| 7,656,321 B2 | 2/2010 | Wang | |
| 7,694,204 B2 | 4/2010 | Schmidt et al. | |
| 7,698,088 B2 | 4/2010 | Sul et al. | |
| 7,706,456 B2 | 4/2010 | Laroia et al. | |
| 7,734,191 B1 | 6/2010 | Welch et al. | |
| 7,746,764 B2 | 6/2010 | Rawlins et al. | |
| 7,868,790 B2 | 1/2011 | Bae | |
| 7,869,546 B2 | 1/2011 | Tsai | |
| 7,882,413 B2 | 2/2011 | Chen et al. | |
| 7,899,653 B2 | 3/2011 | Hollis | |
| 7,933,770 B2 | 4/2011 | Krueger et al. | |
| 8,050,332 B2 | 11/2011 | Chung et al. | |
| 8,055,095 B2 | 11/2011 | Palotai et al. | |
| 8,091,006 B2 | 1/2012 | Prasad et al. | |
| 8,149,906 B2 | 4/2012 | Saito et al. | |
| 8,159,375 B2 | 4/2012 | Abbasfar | |
| 8,159,376 B2 | 4/2012 | Abbasfar | |
| 8,185,807 B2 | 5/2012 | Oh et al. | |
| 8,199,849 B2 | 6/2012 | Oh et al. | |
| 8,199,863 B2 | 6/2012 | Chen et al. | |
| 8,209,580 B1 | 6/2012 | Varnica et al. | |
| 8,218,670 B2 | 7/2012 | Abou | |
| 8,233,544 B2 | 7/2012 | Bao et al. | |
| 8,245,094 B2 | 8/2012 | Jiang et al. | |
| 8,245,102 B1 * | 8/2012 | Cory | H03M 13/19 714/753 |
| 8,279,094 B2 | 10/2012 | Abbasfar | |
| 8,279,745 B2 | 10/2012 | Dent | |
| 8,279,976 B2 | 10/2012 | Lin et al. | |
| 8,284,848 B2 | 10/2012 | Nam et al. | |
| 8,289,914 B2 | 10/2012 | Li et al. | |
| 8,295,250 B2 | 10/2012 | Gorokhov et al. | |
| 8,341,492 B2 | 12/2012 | Shen et al. | |
| 8,365,035 B2 | 1/2013 | Hara | |
| 8,429,492 B2 | 4/2013 | Yoon et al. | |
| 8,429,495 B2 | 4/2013 | Przybylski | |
| 8,462,891 B2 | 6/2013 | Kizer et al. | |
| 8,472,513 B2 | 6/2013 | Malipatil et al. | |
| 8,498,368 B1 | 7/2013 | Husted et al. | |
| 8,520,493 B2 | 8/2013 | Goulahsen | |
| 8,521,020 B2 | 8/2013 | Welch et al. | |
| 8,539,318 B2 | 9/2013 | Shokrollahi et al. | |
| 8,577,284 B2 | 11/2013 | Seo et al. | |
| 8,578,246 B2 | 11/2013 | Mittelholzer et al. | |
| 8,588,254 B2 | 11/2013 | Diab et al. | |
| 8,588,280 B2 | 11/2013 | Oh et al. | |
| 8,593,305 B1 | 11/2013 | Tajalli et al. | |
| 8,620,166 B2 | 12/2013 | Guha | |
| 8,644,497 B2 | 2/2014 | Clausen et al. | |
| 8,649,445 B2 | 2/2014 | Cronie et al. | |
| 8,687,968 B2 | 4/2014 | Nosaka et al. | |
| 8,711,919 B2 | 4/2014 | Kumar | |
| 8,718,184 B1 | 5/2014 | Cronie et al. | |
| 8,755,426 B1 | 6/2014 | Cronie et al. | |
| 8,773,964 B2 | 7/2014 | Hsueh et al. | |
| 8,780,687 B2 | 7/2014 | Clausen et al. | |
| 8,831,440 B2 | 9/2014 | Yu et al. | |
| 8,879,660 B1 | 11/2014 | Peng et al. | |
| 8,938,171 B2 | 1/2015 | Tang et al. | |

(56) References Cited

U.S. PATENT DOCUMENTS

| | | | |
|---|---|---|---|
| 8,949,693 B2 | 2/2015 | Ordentlich et al. |
| 8,989,317 B1 | 3/2015 | Holden et al. |
| 8,996,740 B2 | 3/2015 | Wiley et al. |
| 9,015,566 B2 | 4/2015 | Cronie et al. |
| 9,071,476 B2 | 6/2015 | Fox et al. |
| 9,077,386 B1 | 7/2015 | Holden et al. |
| 9,100,232 B1 | 8/2015 | Hormati et al. |
| 9,152,495 B2 | 10/2015 | Losh et al. |
| 9,172,412 B2 | 10/2015 | Kim et al. |
| 9,183,085 B1 | 11/2015 | Northcott |
| 9,197,470 B2 | 11/2015 | Okunev |
| 9,246,713 B2 | 1/2016 | Shokrollahi |
| 9,251,873 B1 | 2/2016 | Fox et al. |
| 9,288,082 B1 | 3/2016 | Ulrich et al. |
| 9,288,089 B2 | 3/2016 | Cronie et al. |
| 9,300,503 B1 | 3/2016 | Holden et al. |
| 9,331,962 B2 | 5/2016 | Lida et al. |
| 9,362,974 B2 | 6/2016 | Fox et al. |
| 9,363,114 B2 | 6/2016 | Shokrollahi et al. |
| 9,401,828 B2 | 7/2016 | Cronie et al. |
| 9,432,082 B2 | 8/2016 | Ulrich et al. |
| 9,444,654 B2 | 9/2016 | Hormati et al. |
| 9,455,744 B2 | 9/2016 | George et al. |
| 9,461,862 B2 | 10/2016 | Holden et al. |
| 9,479,369 B1 | 10/2016 | Shokrollahi |
| 9,509,437 B2 | 11/2016 | Shokrollahi |
| 9,537,644 B2 | 1/2017 | Jones et al. |
| 9,634,797 B2 | 4/2017 | Benammar et al. |
| 9,667,379 B2 | 5/2017 | Cronie et al. |
| 9,710,412 B2 | 7/2017 | Sengoku |
| 9,852,806 B2 | 12/2017 | Stauffer et al. |
| 10,055,372 B2 | 8/2018 | Shokrollahi |
| 2001/0006538 A1 | 7/2001 | Simon et al. |
| 2002/0044316 A1 | 4/2002 | Myers |
| 2002/0152340 A1 | 10/2002 | Dreps et al. |
| 2002/0154633 A1 | 10/2002 | Shin et al. |
| 2002/0163881 A1 | 11/2002 | Dhong et al. |
| 2002/0174373 A1 | 11/2002 | Chang |
| 2002/0181607 A1 | 12/2002 | Izumi |
| 2003/0016770 A1 | 1/2003 | Trans et al. |
| 2003/0086366 A1 | 5/2003 | Branlund et al. |
| 2003/0185310 A1 | 10/2003 | Ketchum et al. |
| 2004/0057525 A1 | 3/2004 | Rajan et al. |
| 2004/0146117 A1 | 7/2004 | Subramaniam et al. |
| 2004/0155802 A1 | 8/2004 | Lamy et al. |
| 2004/0161019 A1 | 8/2004 | Raghavan et al. |
| 2004/0239374 A1 | 12/2004 | Hori |
| 2005/0213686 A1 | 9/2005 | Love et al. |
| 2006/0013331 A1 | 1/2006 | Choi et al. |
| 2006/0126751 A1 | 6/2006 | Bessios |
| 2006/0159005 A1 | 7/2006 | Rawlins et al. |
| 2006/0291571 A1 | 12/2006 | Divsalar et al. |
| 2006/0291589 A1 | 12/2006 | Eliezer et al. |
| 2007/0030796 A1 | 2/2007 | Green |
| 2007/0076871 A1 | 4/2007 | Renes |
| 2007/0204205 A1 | 8/2007 | Niu et al. |
| 2007/0283210 A1 | 12/2007 | Prasad et al. |
| 2008/0016432 A1 | 1/2008 | Lablans |
| 2008/0104374 A1 | 5/2008 | Mohamed |
| 2008/0192621 A1 | 8/2008 | Suehiro |
| 2008/0316070 A1 | 12/2008 | Van et al. |
| 2009/0046009 A1 | 2/2009 | Fujii |
| 2009/0059782 A1 | 3/2009 | Cole |
| 2009/0141827 A1 | 6/2009 | Saito et al. |
| 2009/0150754 A1* | 6/2009 | Dohmen ............ H03M 13/1535 714/785 |
| 2009/0154604 A1 | 6/2009 | Lee et al. |
| 2009/0316730 A1 | 12/2009 | Feng et al. |
| 2010/0046644 A1 | 2/2010 | Mazet |
| 2010/0054355 A1 | 3/2010 | Kinjo et al. |
| 2010/0081451 A1 | 4/2010 | Mueck et al. |
| 2010/0215112 A1 | 8/2010 | Tsai et al. |
| 2010/0235673 A1 | 9/2010 | Abbasfar |
| 2010/0296556 A1 | 11/2010 | Rave et al. |
| 2010/0309964 A1 | 12/2010 | Oh et al. |
| 2011/0014865 A1 | 1/2011 | Seo et al. |
| 2011/0051854 A1 | 3/2011 | Kizer et al. |
| 2011/0072330 A1 | 3/2011 | Kolze |
| 2011/0235501 A1 | 9/2011 | Goulahsen |
| 2011/0268225 A1 | 11/2011 | Cronie et al. |
| 2011/0286497 A1 | 11/2011 | Nervig |
| 2011/0299555 A1 | 12/2011 | Cronie et al. |
| 2011/0302478 A1 | 12/2011 | Cronie et al. |
| 2012/0036415 A1* | 2/2012 | Shafrir ............ H03M 13/1515 714/785 |
| 2012/0213299 A1 | 8/2012 | Cronie et al. |
| 2013/0010892 A1 | 1/2013 | Cronie et al. |
| 2013/0013870 A1 | 1/2013 | Cronie et al. |
| 2013/0114392 A1 | 5/2013 | Sun et al. |
| 2013/0259113 A1 | 10/2013 | Kumar |
| 2013/0315501 A1 | 11/2013 | Atanassov et al. |
| 2013/0346830 A1 | 12/2013 | Ordentlich et al. |
| 2014/0068385 A1 | 3/2014 | Zhang et al. |
| 2014/0068391 A1* | 3/2014 | Goel ................ H03M 13/152 714/785 |
| 2014/0177645 A1 | 6/2014 | Cronie et al. |
| 2014/0254642 A1 | 9/2014 | Fox et al. |
| 2015/0070201 A1 | 3/2015 | Dedic et al. |
| 2015/0078479 A1 | 3/2015 | Whitby-Strevens |
| 2015/0092532 A1 | 4/2015 | Shokrollahi et al. |
| 2015/0222458 A1 | 8/2015 | Hormati et al. |
| 2015/0236885 A1 | 8/2015 | Ling et al. |
| 2015/0249559 A1 | 9/2015 | Shokrollahi et al. |
| 2015/0333940 A1 | 11/2015 | Shokrollahi |
| 2015/0349835 A1 | 12/2015 | Fox et al. |
| 2015/0365263 A1 | 12/2015 | Zhang et al. |
| 2015/0380087 A1 | 12/2015 | Mittelholzer et al. |
| 2015/0381768 A1 | 12/2015 | Fox et al. |
| 2016/0020796 A1 | 1/2016 | Hormati et al. |
| 2016/0020824 A1 | 1/2016 | Ulrich et al. |
| 2016/0036616 A1 | 2/2016 | Holden et al. |
| 2016/0218894 A1 | 7/2016 | Fox et al. |
| 2016/0380787 A1 | 12/2016 | Hormati et al. |
| 2017/0272285 A1 | 9/2017 | Shokrollahi et al. |
| 2019/0103903 A1 | 4/2019 | Yang |

FOREIGN PATENT DOCUMENTS

| | | |
|---|---|---|
| CN | 101854223 A | 10/2010 |
| CN | 101820288 B | 1/2013 |
| EP | 1926267 A1 | 5/2008 |
| JP | 2003163612 A | 6/2003 |
| WO | 2005002162 A1 | 1/2005 |
| WO | 2009084121 A1 | 7/2009 |
| WO | 2010031824 A1 | 3/2010 |

OTHER PUBLICATIONS

Anonymous, "Constant-weight code", Wikipedia.org, retrieved on Feb. 6, 2017, (3 pages).

Ben-Neticha, Zouhair, et al., "The "Stretched"-Golay and Other Codes for High-SNR Finite-Delay Quantization of the Gaussian Source at 1/2 Bit Per Sample", IEEE Transactions on Communications, New York, US, vol. 38, No. 12, XP000203339, Dec. 1990, 2089-2093 (5 pages).

Burr, A.G., "Spherical Codes for M-ARY Code Shift Keying", Second IEE National Conference on Telecommunications, University of York, UK, Apr. 2, 1989, 67-72 (6 pages).

Counts, Lew, et al., "One-Chip "Slide Rule" Works with Logs, Antilogs for Real-Time Processing", Analog Devices, Computational Products 6, Reprinted from Electronic Design, May 2, 1985, 3-9 (7 pages).

Dasilva, Victor, et al., "Multicarrier Orthogonal CDMA Signals for Quasi-Synchronous Communication Systems", IEEE Journal on Selected Areas in Communications, vol. 12, No. 5, Jun. 1994, 842-852 (11 pages).

Ericson, Thomas, et al., "Spherical Codes Generated by Binary Partitions of Symmetric Pointsets", IEEE Transactions on Information Theory, vol. 41, No. 1, Jan. 1995, 107-129 (23 pages).

Farzan, Kamran, et al., "Coding Schemes for Chip-to-Chip Interconnect Applications", IEEE Transactions on Very Large Scale

(56) References Cited

OTHER PUBLICATIONS

Integration (VLSI) Systems, vol. 14, No. 4, Apr. 2006, 393-406 (14 pages).

Giovaneli, Carlos Lopez, et al., "Space-Frequency Coded OFDM System for Multi-Wire Power Line Communications", Power Line Communications and Its Applications, 2005 International Symposium on Vancouver, BC, Canada, IEEE XP-002433844, Apr. 6-8, 2005, 191-195 (5 pages).

Healey, Adam, et al., "A Comparison of 25 Gbps NRZ & PAM-4 Modulation used in Legacy & Premium Backplane Channels", Tyco Electronics Corporation, DesignCon 2012, Jan. 2012, 1-16 (16 pages).

Holden, Brian, "An exploration of the technical feasibility of the major technology options for 400GE backplanes", IEEE 802.3 400GE Study Group, Geneva, CH, Jul. 16, 2013, 1-18 (18 pages).

Holden, Brian, "Simulation results for NRZ, ENRZ & PAM-4 on 16-wire full-sized 400GE backplanes", IEEE 802.3 400GE Study Group, York, UK, Sep. 2, 2013, 1-19 (19 pages).

Holden, Brian, "Using Ensemble NRZ Coding for 400GE Electrical Interfaces", IEEE 802.3 400GE Study Group, May 17, 2013, 1-24 (24 pages).

Jiang, Anxiao, et al., "Rank Modulation for Flash Memories", IEEE Transactions of Information Theory, vol. 55, No. 5, Jun. 2009, 2659-2673 (16 pages).

Oh, Dan, et al., "Pseudo-Differential Vector Signaling for Noise Reduction in Single-Ended Signaling Systems", DesignCon 2009, Rambus Inc., Jan. 2009, (22 pages).

Poulton, John, "Multiwire Differential Signaling", UNC-CH Department of Computer Science Version 1.1, Aug. 6, 2003, 1-20 (20 pages).

She, James, et al., "A Framework of Cross-Layer Superposition Coded Multicast for Robust IPTV Services over WiMAX", IEEE Wireless Communications and Networking Conference, Apr. 15, 2008, 3139-3144 (6 pages).

Skliar, Osvaldo, et al., "A Method for the Analysis of Signals: the Square-Wave Method", Revista de Matematica: Teoria y Aplicationes, vol. 15, No. 2, Mar. 2008, 109-129 (21 pages).

Slepian, David, "Permutation Modulation", Proceedings of the IEE, vol. 53, No. 3, Mar. 1965, 228-236 (9 pages).

Wang, Xin, et al., "Applying CDMA Technique to Network-on-Chip", IEEE Transactions on Very Large Scale Integration (VLSI) Systems, vol. 15, No. 10, Oct. 1, 2007, 1091-1100 (10 pages).

\* cited by examiner

PIPELINED FORWARD ERROR CORRECTION FOR VECTOR SIGNALING CODE CHANNEL

CROSS-REFERENCE TO RELATED APPLICATIONS

This application claims the benefit of U.S. Provisional Application No. 62/485,677, entitled "Pipelined Forward Error Correction for Vector Signaling Code Channel", filed Apr. 14, 2017, which is hereby incorporated herein by reference in its entirety.

REFERENCES

The following prior applications are herein incorporated by reference in their entirety for all purposes:

U.S. Pat. No. 9,288,089 of application Ser. No. 12/784,414, filed May 20, 2010, naming Harm Cronie and Amin Shokrollahi, entitled "Orthogonal Differential Vector Signaling" (hereinafter "Cronie I").

U.S. patent application Ser. No. 13/154,009, filed Jun. 5, 2011, naming Harm Cronie and Amin Shokrollahi, entitled "Error Control Coding for Orthogonal Differential Vector Signaling" (hereinafter "Cronie II").

U.S. Pat. No. 8,296,632 of application Ser. No. 12/479,605, filed Jun. 5, 2009, naming Amin Shokrollahi, entitled "Encoding and decoding of generalized Reed-Solomon codes using parallel processing techniques" (hereinafter "Shokrollahi I").

U.S. patent application Ser. No. 14/612,241, filed Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi II].

The following additional references to prior art have been cited in this application:

"FEC Codes for 400 Gbps 802.3bs", by Sudeep Bhoja, Vasu Parthasarathy, and Zhongfeng Wang, IEEE 802 Standards Working Group presentation archived at: www<dot>ieee802.org/3/bs/public/14_11/parthasarathy_3bs_01_a_1114.pdf and herein identified as [Bhoja et al].

FIELD OF THE INVENTION

Present embodiments relate to communications systems circuits generally, and more particularly to reduction of communication errors over a high-speed multi-wire interface used for chip-to-chip communication.

BACKGROUND

In modern digital systems, digital information is processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In such vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

BRIEF DESCRIPTION

In conventional bit-serial communications systems, data words provided by a transmitting or source process are serialized into a sequential stream of bits, in one exemplary embodiment using a digital shift register. At the receiver, sequentially detected bits are deserialized using comparable means, so that a receiving or destination process may be presented with complete data words equivalent to those provided at the transmitter. Vector signaling code communication systems perform comparable operations, although in these embodiments the serialization process generally breaks words into symbol groups (e.g. into five bit elements for a CNRZ-5 system) and the equivalent deserialization process assembles received groups (of five bits, continuing the same example) into words again.

Forward Error Correction (FEC) methods have been developed which introduce redundancy into such transmitted data streams as part of a check code that both detects and facilitates correction of errors. In cases where the native communications link has relatively low uncorrected BER (e.g., $1 \times 10^{-9}$ to $1 \times 10^{-10}$ and the target BER is of the order of $1 \times 10^{-15}$ to $1 \times 10^{-20}$, a novel solution is described that can be computed at transmission during the serialization of emitted values, and can be verified during reception during deserialization, so that in the non-error case little or no additional latency is introduced into the communications path.

In some embodiments, a method includes decoding, using a vector signal code receiver, a predetermined number of sequentially received vector signaling codewords to obtain sequential sets of data bits, wherein elements of each vector signaling codeword are received in parallel over a plurality of wires, generating, using a FEC check circuit, an incremental update of a plurality of error correction syndrome values based on each sequential set of data bits according to a check matrix, and upon decoding of a final vector signaling codeword of the predetermined number of received vector signaling codewords, performing a final incremental update of the plurality of error correction syndrome values and responsively modifying data bits within the sequential sets of data bits by selecting a set of data bits from the sequential sets of data bits according to a symbol position index determined from the plurality of error correction syndrome values, the selected set of data bits altered according to a bit error mask determined from a first error correction syndrome value of the plurality of error correction syndrome values.

DETAILED DESCRIPTION

Figure 1:
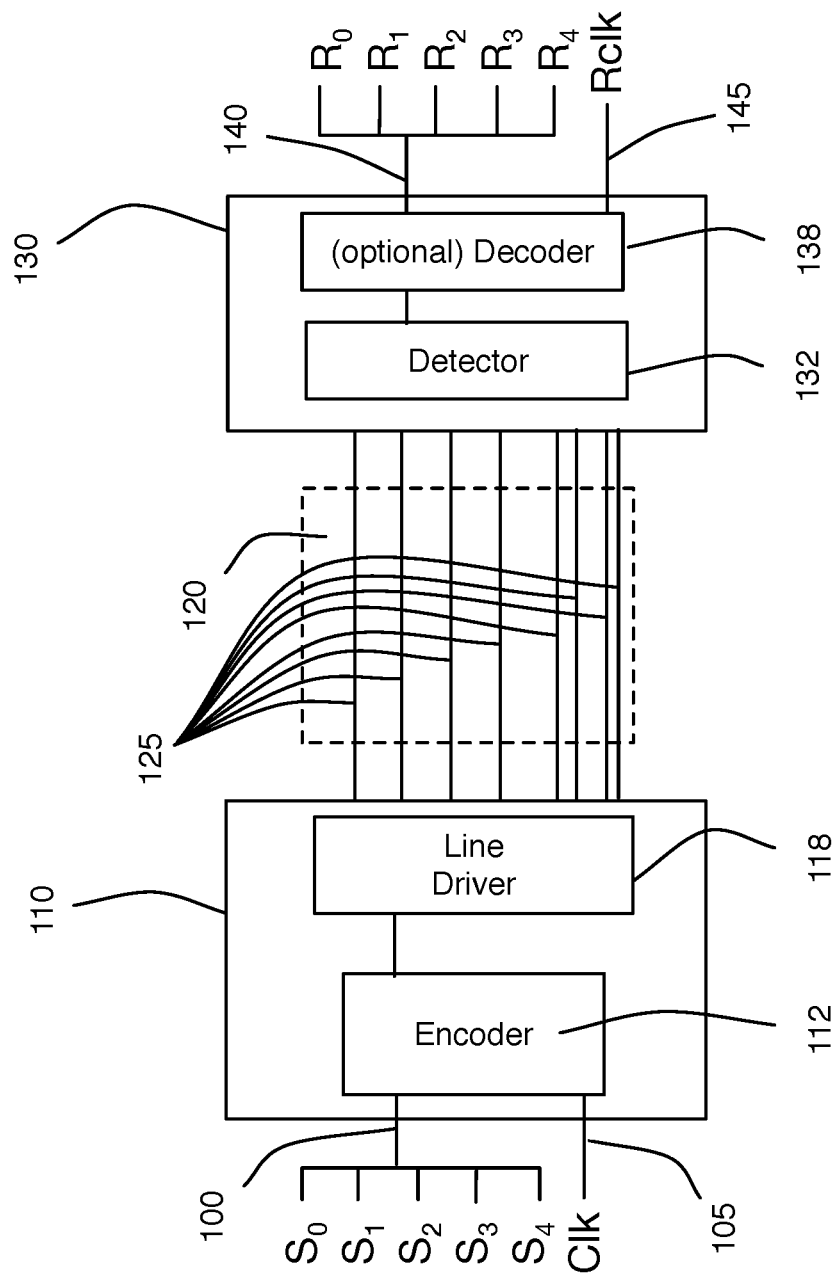
FIG. 1 is a block diagram of a prior art communications system to transmit data S from a transmitter 110 over a set of 125 collectively comprising the communications medium 120 to a receiver 130 outputting received data R.

As described in [Cronie I], [Cronie II], and [Shokrollahi II], vector signaling codes may be used to produce extremely high bandwidth data communications links, such as between two integrated circuit devices in a system. As illustrated by the embodiment of FIG. 1, a data communications channel 120 composed of multiple wires 125 carries symbols of the vector signaling code, acting together to communicate codewords of the vector signaling code. Depending on the particular vector signaling code used, the number of channels including a communications link may range from two to eight or more, and may also communicate one or more clock signals on separate communications channels or as subchannel components of the vector signaling code. In the example of FIG. 1, communication link 120 is illustrated as being composed of eight wires 125, collectively communicating five data values 100 and one clock 105 between transmitter 110 and receiver 130. Further descriptions of such communications links are provided in [Shokrollahi II].

Individual symbols, e.g. transmissions on any single communications channel, may utilize multiple signal levels, often three or more. Operation at channel rates exceeding 10 Gbps may further complicate receive behavior by requiring deeply pipelined or parallelized signal processing. Embodiments described herein may also be applied to prior art permutation sorting methods not covered by the vector processing methods of [Shokrollahi II]. More generally, embodiments may apply to any communication or storage methods requiring coordination of multiple channels or elements of the channel to produce a coherent aggregate result.

Due to the characteristic of transmitting multiple symbols essentially in parallel, vector signaling codes are generally considered as communicating data in symbol groups, for example in five-bit increments for the CNRZ-5 code (also known as Glasswing Code) of [Shokrollahi II]. Thus, this document may subsequently describe transport as occurring in increments of K*n bits, where n is that code's symbol group or payload size. That reference additionally notes, however, that the encoded subchannels transporting individual bits are mathematically distinct, and in certain embodiments may be treated as independent transport channels.

Serialization and Deserialization

In conventional bit-serial communications systems, data words provided by a transmitting or source process are serialized into a sequential stream of bits, in one exemplary embodiment using a digital shift register. At the receiver, sequentially detected bits are deserialized using comparable means, so that a receiving or destination process may be presented with complete data words equivalent to those provided at the transmitter. Vector signaling code communication systems perform comparable operations, although in these embodiments the serialization process generally breaks words into symbol groups (e.g. into five bit elements for a CNRZ-5 system) and the equivalent deserialization process assembles received groups (of five bits, continuing the same example) into words again.

As is readily apparent, serialization and deserialization introduce latency into the communication channel, with the amount of latency dependent on the number of transmitted elements into which a given data word is serialized, as the entire word is not available until its last-transmitted element has been received and the received word fully reassembled.

In some high-speed communications systems, serialization and deserialization may additionally incorporate multiple processing phases operating essentially in parallel, to provide additional processing time within each phase and/or to permit processing operation using a lower clock rate to reduce power consumption. In one representative embodiment, data words presented by the transmission or source process are broken into words, with consecutive words being assigned to sequentially chosen processing phases which perform the necessary encoding, formatting, etc. As each processing phase completes its operations, the processed results are transferred to an output driver for transmission over the communications medium. Thus, in the case where four processing phases are used, each phase will have approximately four transmit unit intervals of time to perform the necessary operations. Similar multiphase processing may occur at the receiver; consecutively received words being detected by sequentially assigned processing phases and reassembled into output words.

Embodiments incorporating multiple processing phases are used herein as descriptive examples, so as to provide the broadest and most complete illustration of features and behaviors. Other embodiments may utilize fewer or more processing phases, including a single instance, and may incorporate greater or lesser amount of transmit and/or receive processing into the essentially parallel processing phases, with no limitation implied by these examples.

Link Error Correction

Communications system designs emphasize error-free transport of data, despite the inevitable presence of noise and other signal disruptions. Error probabilities over the communications path are expressed as a Bit Error Rate (BER), representing the ratio of bit errors received to overall bits transmitted.

Solutions to detect bit errors, including cyclic check codes, parity, and redundant transmission, are known in the art. Similarly, solutions are known for correction of errors, most notably the closed-loop retransmission methods of the TCP/IP protocol suite, in which a receiver detects an error, uses a return channel to request a retransmission by the transmitter, and then transparently inserts the corrected data into its output stream. Further, the term of art "cyclic redundancy check (CRC)" is used herein to describe any set of computed bits augmenting a data stream to enable error identification and correction.

Forward Error Correction

Where use of a return channel is impossible or the round-trip latency of waiting for a retransmission is unacceptable, Forward Error Correction (FEC) methods have been developed which introduce redundancy into the transmitted data stream as part of a check code that both detects and facilitates correction of errors. The more redundancy introduced into the transmitted data stream (e.g. by use of a longer FEC sequence) the greater the ability of the FEC to correct bit errors, but also the greater the protocol overhead, presenting itself as a lower effective data transmission rate.

As noted in [Bhoja et al.], several FEC techniques have been proposed for use over high speed communications links, including the KR4 and KP4 codes as defined for 802.3bj, as well as BCH codes, for example of length 2864 and dimension 2570. Further examples include the Reed-Solomon codes described in [Shokrollahi I] and the Hamming, Hadamard, Reed-Muller, Golay, and Low-Density Parity Check (LDPC) codes of [Cronie II]. These error correction methods target communications links with relatively high uncorrected BER (on the order of $1\times10^{-5}$ to $1\times10^{-3}$) while delivering corrected error rates on the order of $1\times10^{-15}$, thus they rely on computing a relatively long check sequence over a large block of data. The resulting error correction latencies are on the order of many tens of nano-seconds (e.g. 100 ns, as reported by [Bhoja et al.]) with correspondingly large computational power consumption.

In cases where the native communications link has relatively low uncorrected BER (e.g., $1\times10^{-9}$ to $1\times10^{-10}$ and the target BER is of the order of $1\times10^{-15}$ to $1\times10^{-20}$, other solutions can be found with much lower latency. This is the case, for example, for in-package die-to-die links that use vector signaling codes, such as the Glasswing or CNRZ-5 code of [Shokrollahi II].

For vector signaling codes transmitting n bits at a time over m wires, it is advantageous to work with an FEC operating in the Galois field $GF(2^n)$ since an error in the communication link is likely to cause errors on all n bits.

Pipelining Error Correction Processing

One embodiment of a link-optimized Forward Error Correction uses sequential data word transmission by the transport level vector signaling code to minimize perceived error correction latency. In such an embodiment, a vector signaling code transport communicates groups of n bits over m wires. Transmission of N consecutive groups thus transfers N*n bits, consisting of K*n data bits and R*n CRC bits for error correction. At the transmitter, a data source provides the K*n data bits, typically as multiple transfers over a wide parallel interface, with a similar interface delivering the received K*n data bits to a data sink at the receiver.

As a specific example offered without implying limitation, we consider n=5 and m=6 for a CNRZ-5 transport and N=32 a typical message length. This may equivalently be interpreted as 5 simultaneous streams each transmitting 32 consecutive bits. A Forward Error Correction code over $GF(2^n)$ operating on 5-bit words will be capable of correcting one bit error. If p is the input BER, and assuming random and independent errors on every stream from UI to UI (but not independent among the 5 bits making up the word in every UI), then the output BER after decoding is at most $$\frac{1+qN-(1-q)^N-2Nq(1-q)^{N-1}-q^N}{N} \qquad \text{(Eqn. 1)}$$

where $q=1-(1-p)^5$, and N=32. To achieve an output BER of $1\times10^{-15}$, an input BER p of $8\times10^{-10}$ is sufficient. The rate of this code is 15/16=93.75%, hence the rate loss is 6.25%. In such embodiments, at 26.66 Gbaud, the interface may transmit 5*26.66*0.9375=125 Gbps of data over 6 wires.

Transmission with FEC

At the transmitter, this embodiment performs the following operations:

The 5 bits to be transmitted at each Unit Interval (UI) are treated as elements of the field GF(32). For example, If n0, n1, n2, n3, n4 denote the 5 bits, wherein n0 is the lowest significant bit of n and n4 is the highest significant bit, then n corresponds to the element $$n0+n1*x+n2*x^2+n3*x^3+n4*x^4 \bmod f(x) \qquad \text{(Eqn. 2)}$$

and f(x) is the polynomial $x^5+x^3+1$

A check matrix of elements of GF(32) with 2 rows and 30 columns is used. In one embodiment, the elements in column/of this matrix are 1 and $a_j$, where the element $a_j$ of GF(32) is the binary expansion of an integer j, that is, $a_j$ is represented as the binary vector [j0 j1 j2 j3 j4], where j0+2*j1+4*j2+8*j3+16*j4=1. While other embodiments may use alternate check matrices, use of the check matrix using the binary expansion of the integer j as the second row of elements results in efficiencies in calculating the error position vector that identifies which received symbol contains the error(s). In particular, this obviates the need to use the Berlekamp Massey algorithm (including the associated Chien search). In addition, directly calculating the bit error mask using the row of 1's in the check matrix obviates the need to use Forney's formula to determine the error magnitude. Equation 3 for calculating r0 and r1 using the check matrix described above is given below:

$$\begin{bmatrix} 1 & 1 & \ldots & 1 & 1 \\ a_0 & a_1 & \ldots & a_{28} & a_{29} \end{bmatrix} \cdot \begin{bmatrix} m_0 \\ m_1 \\ \vdots \\ m_{28} \\ m_{29} \end{bmatrix} = \begin{bmatrix} r_0 \\ r_1 \end{bmatrix} \qquad \text{(Eqn. 3)}$$

In equation 3, the check matrix including two rows of constants (one row of all 1's and one row of $a_0$-$a_{29}$) is modulo-multiplied by a vector including the 30 data symbols m0-m29 to generate the CRC words r0 and r1.

If the incoming 30 5-bit data words (the bits of which will be communicated essentially simultaneously on the 5 CNRZ-5 sub-channels) are denoted by m0, m1, ..., m29, then the two CRC 5-bit words, denoted r0 and r1, are obtained as r0=m0 ⊕m1⊕ ... ⊕m29 and r1=a0·m0 ⊕a1·m1⊕ ... ⊕a29·m29 wherein a·b denotes the multiplication of a and b in the field GF(32) and ⊕ denotes the bit-wise XOR operation. Thus, r1 may be generated by incrementally updating the previously stored value of r1 in the jth unit interval by providing a bit-wise XOR of the previously stored value of r1 with the modulo-multiplied result of aj·mj, and the final value of r1 is generated upon the final incremental update.

The message data m0, m1, ... m29 corresponds to 5-bit words at time instance 0, 1, ..., 29; therefore, the computation of CRC words r0, r1 can be done incrementally, as the data becomes available. The computation is equivalent to Set r0=r1=0
For j from 0 to 29 do $$r0[i]=r0[i]\oplus mj[i]$$

$$r1=r1\oplus aj\cdot mj$$

Figure 4A:
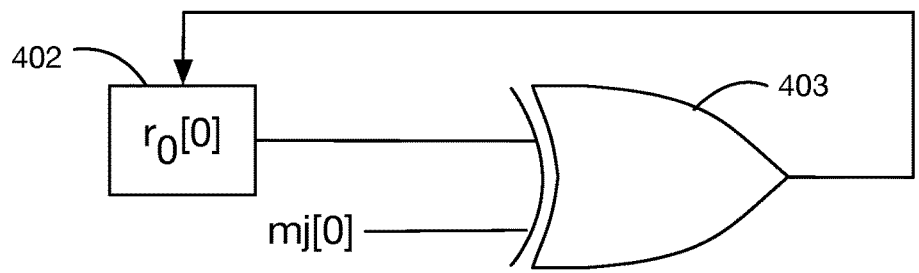
FIGS. 4A-4C are block diagrams for CRC word calculation, in accordance with some embodiments.

FIG. 4A includes a schematic for calculating values of r0, in accordance with some embodiments. As shown, a given value of r0 is updated by XORing 403 the previously stored value 402 of r0 with a corresponding bit in an associated position of data word $m_j$. For example, r0[0] may be XOR'd with mj[0], r0[1] may be XOR'd with mj[1], etc. Thus for index i, with $0 \leq i \leq 4$, $r0[i]=m0[1]\oplus m1[i]\oplus \ldots \oplus m29[i]$. Such an embodiment may operate recursively, e.g. when each bit mj[i] becomes available. In such an embodiment, each data bit mj[i] may be provided via a shift register, for example. Alternatively the computation may be performed all at once when all of the data words are available, using a logical XOR tree shown in FIG. 4B for example.

Figure 4B:
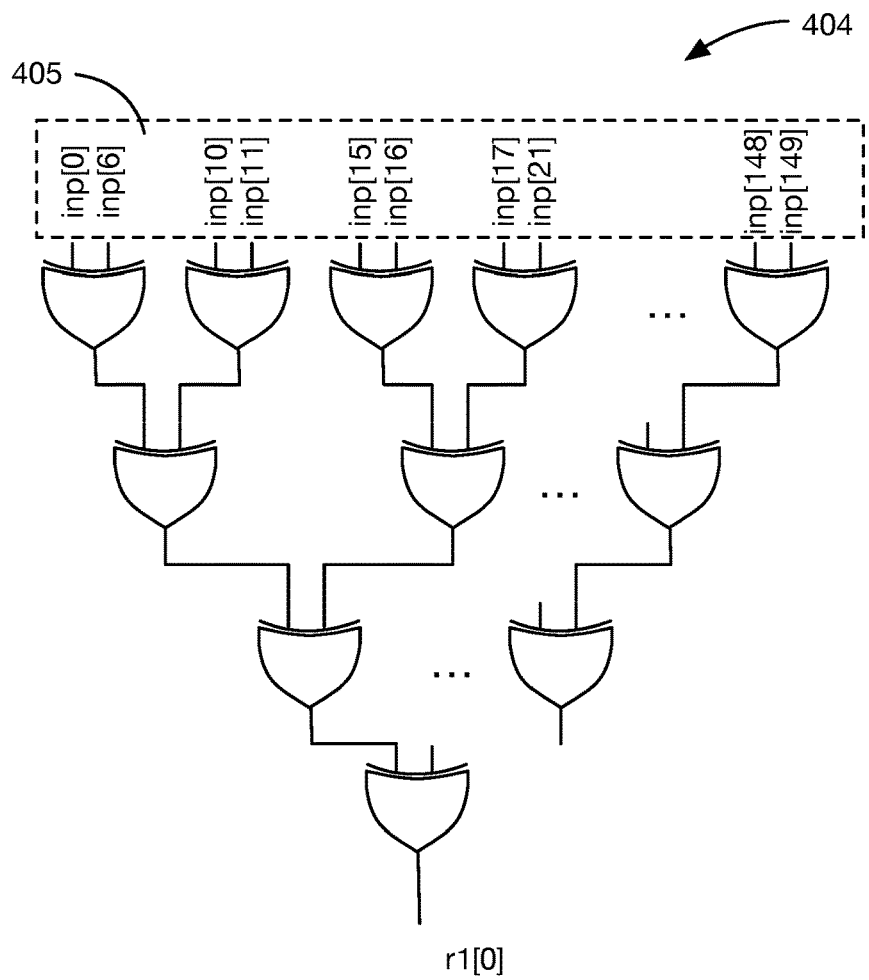

As described above, calculating r1 includes modulo-reduced multiplication of a $a_j$ element from the GF(32) matrix with a corresponding data word mj, and XORing the results together. In some embodiments, an FEC encoder may form an XOR tree 404 as shown in FIG. 4B. Such an XOR tree may be formed using a known logic combination, such as the combinations for calculating r0 and r1 given in Appendix A. Such an embodiment may obtain all the data bits (150 in the above examples) prior to performing the calculation using an XOR tree. FIG. 4B illustrates one particular example for calculating r1[0]. In such an embodiment, the inputs 405 may be predetermined, and selected according to the bits used to update r1[0] according to Appendix A.

Figure 4C:
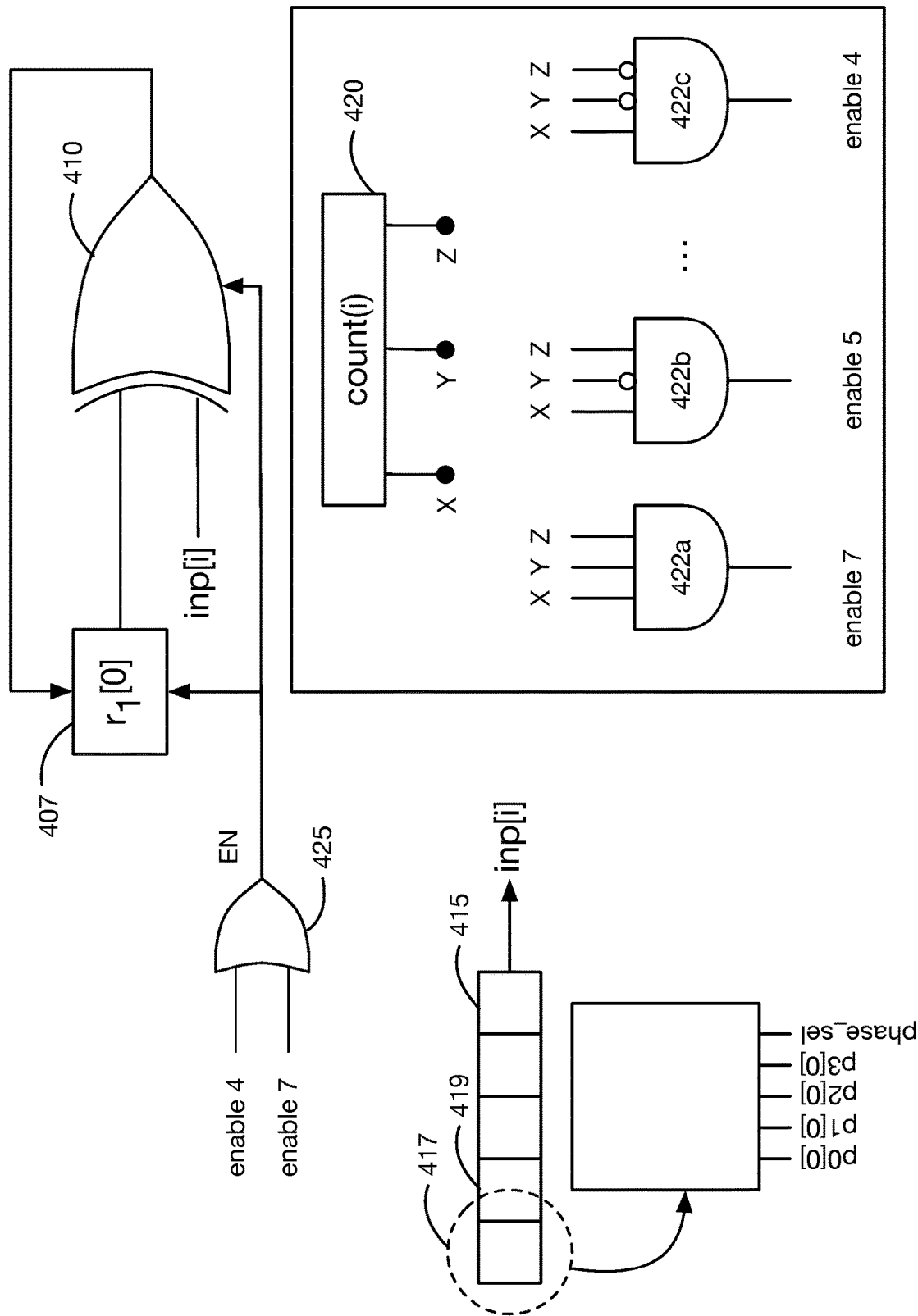

FIG. 4C is a schematic of an alternative logic circuit for incrementally updating a given bit r1[0] as part of CRC word r1, in accordance with some embodiments. In the schematic of FIG. 4C, the values of r1 may be incrementally updated according to CRC calculations corresponding to a modulo-multiplications of a set of data bits of a given symbol with a symbol index from the check matrix. In such an embodiment, the updating may be performed as the bits from each set of data bits of symbols m0-m29 becomes available, thus reducing latency. As shown, FIG. 4C includes a storage element 407 holding a current value of r1 [0]. The current value r1[0] is XOR'd 410 with a sequence of the K*n data bits determined by the CRC calculation, the ith bit of the FEC data bits denoted as inp[i]. The notational sequence inp[i] represents the input data being processed, where inp[0 ... 4] are the 5 bits of data word m0, inp[5 ... 9] are the 5 bits of data word m1, inp[145 ... 149] are the 5 bits of symbol m29 using the above embodiment having K=30 sets of n=5 data bits.

The current value r1[0] may not be updated for every bit of the K*n data bits, thus an associated enable signal EN is used to selectively update the current value of r1[0] according to a predetermined set of bits (See Appendix A). As shown, the K*n data bits are serially input into the XOR 410 using a shift register 415, which may obtain the bits from data buffer 210 in the transmitter, in some embodiments (not shown).

In receiver embodiments calculating r1', shift register 415 may be connected to processing phases 330, as shown in FIG. 4C. Alternatively, each phase may have a corresponding shift register, all of which may be multiplexed (not shown). In some embodiments, shift register 415 may be parallel loaded. In such embodiments, shift register 415 may include a plurality of D Flip-Flops that may be loaded in parallel, and serially shifted out to XOR 410. Block 417 illustrates one storage element of shift register 415, in accordance with some embodiments. As shown, storage element 417 is connected to the outputs of MIC0 of each of the four processing phases 330, denoted here as p0[0]-p3[0] Further, a phase selection signal denoted 'phase_sel' is used to select which phase to load the storage element 417 with. In some embodiments, the selected phase may be provided to the block via a multiplexor accepting the phases, and the select signal may take the form of a two-bit clock counter to select which phase loads the register (not shown). While storage element 417 receives outputs from MIC0 of each processing phase, each other storage element of the shift register 415 may similarly receive a corresponding MIC output of the plurality of processing phases. For example, storage element 419 may receive the output of MIC1 of each processing phase.

FIG. 4C further includes a counting circuit used to generate partial enable signals, including partial enable signals 4, 5, and 7, which may then be combined to form a corresponding global enable signal EN for bit r1[0]. As shown, the counting circuit includes a counter 420 and a plurality of AND logic gates 422a, 422b, and 422c. In some embodiments, the counter is configured to count from i=0 to i=K*n−1, i being an index associated with a corresponding data bit inp[i] of the K*n data bits. The output of the current value i of the counter 420 may be represented as a set of bits (shown as X,Y,Z in FIG. 4C). AND logic gates 422a-c receive bits X,Y,Z, each AND gate 422a-c having a corresponding combination of inverting and non-inverting inputs such that for each count value 1, only one of the partial enable signals is logic '1' at a given count value, and all the rest are logic '0'. In some embodiments, a respective global enable signal EN for each bit of the CRC words r1 is formed by OR'ing 425 the partial enable signals associated with the indices i of the bits in the predetermined set of known bits. In the illustrative example of FIG. 4C, r1[0] is only updated using bits inp[4] and inp[7]. Thus, the global enable EN is formed by OR'ing partial enables 4 and 7, and r1[0] is updated when count i=4 and 7, using bits inp[4] and inp[7], respectively. For illustrative purposes only, counter 420 only shows 3 bits X,Y,Z forming a binary count value i, however it should be noted counter 420 may include any number of bits. For example, in the examples given above and in Appendix A, the counter may form count values i having 8 bits to count from i=0 to i=149 (resetting at 1=149), to update the bits of CRC word r1.

The embodiments illustrated by FIGS. 4A-4C are just some examples of a logic circuit that may be hardwired to implement the calculation of each bit of the CRC words r0 and r1. There may be various other logic designs to perform such a calculation. For example, alternative embodiments may utilize a processor running a software application to calculate the variables.

Once the incoming data is processed completely CRC words r0 and r1 are transmitted as the last two words, herein identified as m30 and m31. In an alternative embodiment, the transmitter may first calculate r0 and r1 based on the available buffered transmit data and transmit the five bits of r0 and the five bits of r1 using the first and second vector signaling codewords. In this embodiment, the decoder may then advantageously initialize the decoding circuit (FEC check circuit used to calculate syndrome values) using those two check values.

Since the elements a0, a1, . . . , a29 are known in advance, whereas m0, m1, . . . , m29 are variable, each of the multiplications in GF(32) can be done through a sequence of XOR operations on the 5 bits. This is done via a "regular representation of the field GF(32)" as is known to those of skill in the art. In this representation, each of the elements a0, a1, . . . , a29 is represented as a 5×5 matrix of bits, and the multiplication a [j] m[j] then corresponds to the multiplication of this matrix with the vector representing m[j].

One embodiment of a sequence of such operations is provided in Appendix A for a particular regular representation of GF(32), without implying limitation. Many other representations can also be used which would lead to similar results.

The computations at the transmitter are preferably done concurrently with the serialization step; that is, as each incremental data group becomes available and is prepared for transmission. This "pipelining" of the FEC computation avoids the additional latency that is often encountered when using forward error correction techniques. In embodiments utilizing multiple essentially parallel processing phases in the transmission process, elements of the computation of r0, r1 can be done within each processing phase. In some embodiments, at least one such processing phase incorporates XOR logic to facilitate at least a portion of such computation.

Figure 2:
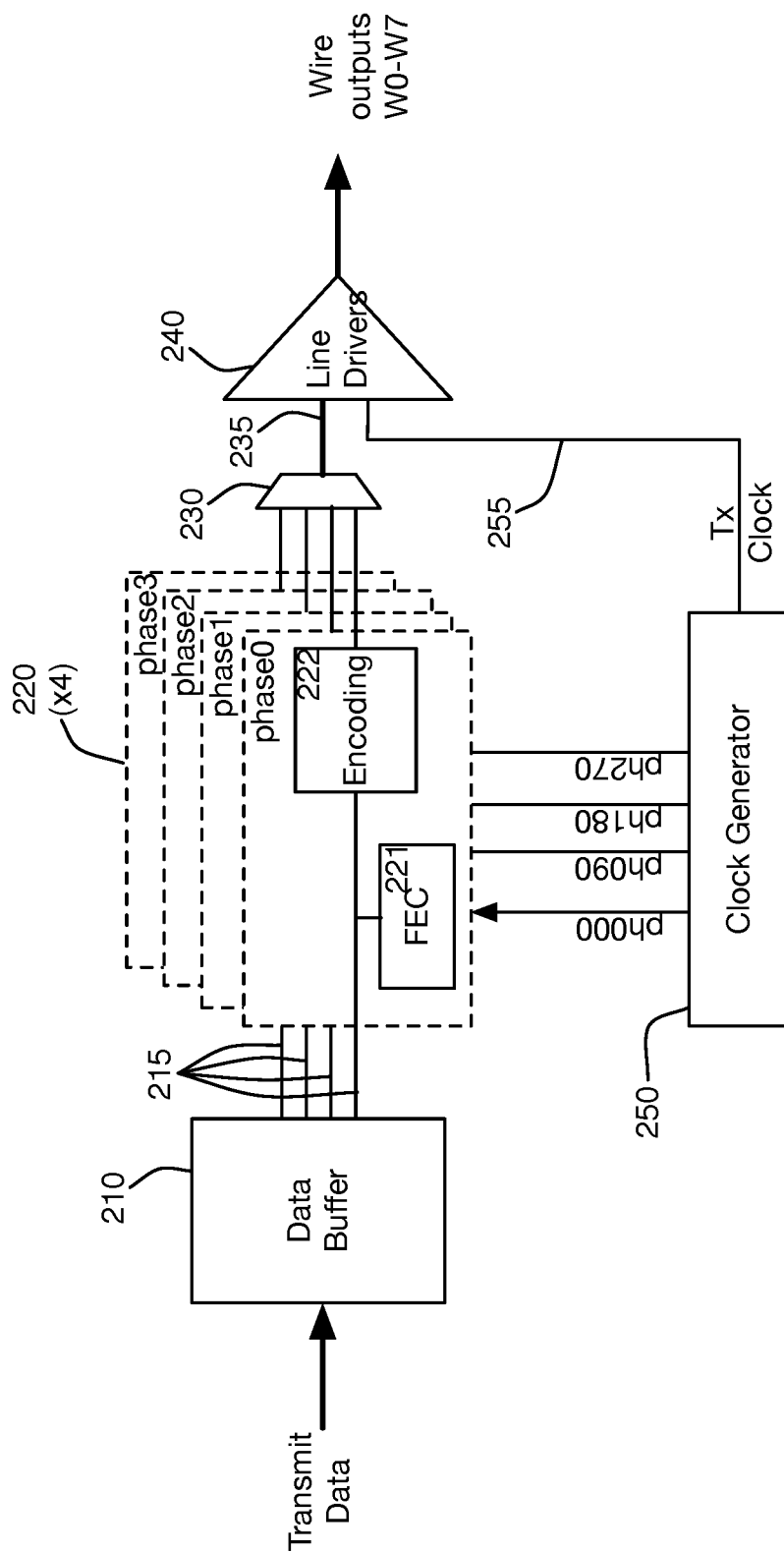
FIG. 2 shows one embodiment of a transmitter incorporating the described Forward Error Correction in a data path utilizing multiple processing phases.

FIG. 2 illustrates one embodiment of a transmitter using the CNRZ-5 code of [Shokrollahi II.] Transmit Data is accepted into Data Buffer 210; typically, the source of this data will preferentially transfer data as words of, as examples offered without limitation, 16, 32, or 64 bits. Data Buffer 210 accepts these input word transfers, and outputs symbols m0, m1, . . . m29 corresponding to sets of data bits (in this example, each symbol corresponding a set of five data bits) with successive symbol distributed 215 to processing phases phase0, phase1, phase2, phase3, and so on in a circular sequence over all processing phases 220. Within each processing phase 220, the previously described FEC computation 221 is performed on each set of five data bits, as they are simultaneously CNRZ-5 Encoded 222. Under control of Clock Generator 250, each processing phase produces a result that is selected by multiplexor 230, with the output symbols 235 presented to Line Driver 240 to be emitted over the communications channel comprised of wires $W_0$-$W_7$. As described in [Shokrollahi II], Tx Clock 255 is also produced by Clock Generator 250 and emitted by Line Drivers 240 as part of the transmitted output on wires $W_6$ and $W_7$ in the example of FIG. 2.

The multiple instances of FEC computation 221 may access a common set of registers or storage elements to update CRC words r0, r1 during processing of the first 30 output words utilizing data obtained from Data Buffer 210, following which a FEC processing element in a processing phase will output r0 as the $31^{st}$ output word to be encoded by encoder 222, and a FEC processing element in the next selected processing phase will output r1 as the $32^{nd}$ output word to be encoded by vector signal encoder 222.

Reception and Error Correction

At the receiver, a compatible embodiment performs a similar set of CRC computations. 32 5-bit words are received one after another, with the first 5-bit word, called m0 arriving at time 0, and the $32^{nd}$ 5-bit word, called m31, arriving at time (UI*31), where UI is the transport's unit interval for symbol transmission. In such an embodiment, local CRC words r0' and r1' are generated, and error correction syndrome values r0" and r1" are finalized by comparing local CRC words r0' and r1' to received CRC words r0 and r1. Alternatively, FEC check circuit 332 may be initialized by receiving CRC words r0 and r1 from the transmitter first, and incrementally updating the plurality of error correction syndrome values initialized by received CRC words r0 and r1 according to the sequential sets of data bits.

In a first step of receive error correction, the operations in Appendix A are executed, preferably concurrent with the deserialization step for the first 30 data words, to incrementally calculate values for local CRC words r0' and r1'. As with the transmitter, each of these incremental calculations is performed using only the 5 bit word value received and the values being incrementally computed. As described for the transmitter, one embodiment incorporates XOR logic to perform at least part of this computation in at least one of multiple receive processing phases. In some embodiments, similar circuits as shown in FIGS. 4A-4C may be used to calculate the values of r0' and r1'. In some embodiments, local CRC words r0' and r1' may be calculated as bits from the data words m0-m29 become available, while alternative embodiments may calculate r0' and r1' once all of the data words have been received.

Once the first 30 received sets of data bits are processed to incrementally update a plurality of error correction syndrome values, preferably during the deserialization step, r0' is XOR'd with the received CRC word m30 (r0) and r1' is XOR'd with the received CRC word m31 (r1) to generate error correction syndrome values r0" and r1", respectively. For the purposes of description, r0" and r1" may be referred to both as error correction syndrome values (upon the final incremental update), as well as syndrome words At this point, r0" and r1" contain the so-called "syndromes" of the forward error correcting code. If either r0" or r1" is zero, then there has been no error among the transmitted sets of data bits m0, . . . , m29, and no further processing is necessary. It is possible that there could have been an error among these words that was not caught by the incremental updates of the error correction syndrome values, but the frequency of such undetected errors is within the corrected BER as calculated above. At least one embodiment utilizes multiple receive processing phases, each receive processing phase incorporating logic configured to perform at least a portion of the operations in Appendix A or their logical equivalent, and configured to perform the described XOR operations to obtain the FEC syndromes.

In some embodiments, the plurality of error correction syndrome values of the FEC circuit at the receiver may be initialized by receiving CRC words r0 and r1 from the transmitter in the first two unit intervals, and thus r0" and r1" can be calculated directly due to the incremental updates based on the obtained sequential sets of data bits. In some embodiments, the FEC check circuit may perform bit-wise iterative calculations in the circuit, as shown in FIG. 4C, however, alternative embodiments may implement predetermined combinatorial logic circuits based on logical expressions, e.g., those listed in Appendix A, to update the error correction syndrome values using one or more of the set of decoded data bits. Such a circuit may be similar to the combinatorial logic circuit of FIG. 4B, however as not all the data bits may not be available to the receiver at one time, the combinatorial logic circuit may be hardcoded to update the error correction syndrome values using bits selected according to the index of the current received set of data bits in the current received symbol. For example, error correction syndrome value r1[1] may be updated using one bit of symbol m0 (inp[1] of Appendix A), and then r1[1] may subsequently be updated using three bits of symbol m1 (inp[5], inp[6], and inp[7]). A control logic may be hard-coded according to Appendix A to provide such incremental updates. Alternatively, a control logic may be coded to implement binary modulo arithmetic according to the algorithm for calculating r1 described in the pseudocode above.

If both error correction syndrome values r0" and r1" are non-zero, the received data bits are corrected for errors; r0" is the 5-bit error mask, and the symbol position index of the symbol containing the error is determined by the vector r1"/r0", where division is interpreted in the field GF(32). The error correction operations of computing the error index r1"/r0" and the XOR of the error mask onto the word mt may occur after the deserialization step. Here symbol position index t=pos-1, where pos is the integer representation of r1"/r0". In one embodiment offered as an example without implying limitation after pos=r1"/r0" is computed, a barrel shifter performs a bit-wise XOR function by applying the bit error mask r0" to values of the selected set of data bits mt.

More precisely, the decoding can be described by the following pseudo-code:
IF r0"≠0 AND r1"≠0 THEN
    Compute x[0], . . . , [4] via the procedure in Appendix B Set pos=[0]+2x[1]+4x[2]+8x[3]+16x[4]

Set t=pos-1

Set mt[0]:=mt[0]⊕r0"[0]

Set mt[1]:=mt[1]⊕r0"[1]

Set mt[2]:=mt[2]⊕r0"[2]

Set mt[3]:=mt[3]⊕r0"[3]

Set mt[4]:=mt[4]⊕r0"[4]

As stated above, r1" is divided by r0" in order to obtain the symbol position index (represented in the following equation 4 as b):

$$\begin{bmatrix} r_0'' \\ r_1'' \end{bmatrix} = err \begin{bmatrix} 1 \\ b \end{bmatrix} = \begin{bmatrix} err \\ err(b) \end{bmatrix} \quad \text{(Eqn. 4)}$$

Figure 5A:
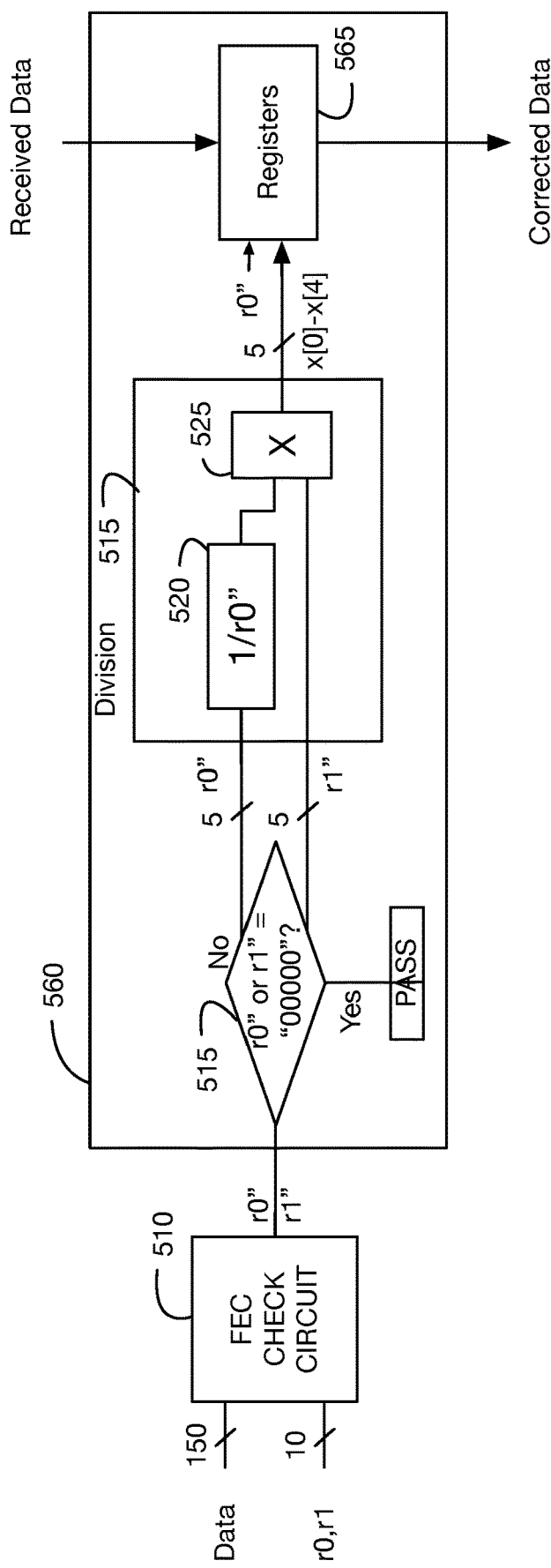
FIGS. 5A and 5B are block diagrams illustrating components of an error correction circuit, in accordance with some embodiments.

FIG. 5A is a block diagram of one embodiment of an error correction circuit 560 connected to FEC check circuit 510, in accordance with some embodiments. In some embodiments, error correction circuit 560 may correspond to error correction 360 shown in FIG.>3. As shown, FEC check circuit 510 sequentially obtains the 150 data bits from the thirty decoded 5-bit data words, and 10 bits making up the received CRC words r0, and r1. The FEC check circuit 510 generates incremental updates to a plurality of error correction syndrome values. In some embodiments, error correction syndrome values in the FEC check circuit are initialized to be quiescent (all zeroes), and the FEC check circuit generates local CRC words r0', r1' based on the received data bits, and in the final incremental update, the FEC check circuit XORs r0⊕r0' and r1⊕r1' to generate error correction syndrome values r0" and r1", respectively. Alternatively, as previously described, the CRC words r0 and r1 may be received from the transmitter in the first unit intervals, and the error correction syndrome values may be initialized with the received CRC words. The FEC check circuit 510 may then subsequently generate incremental updates to the error correction syndrome values, and upon the final incremental update, the error correction syndrome values r0" and r1" are complete without the need to perform the additional XOR step of the previous embodiment. In some embodiments, the FEC check circuit 510 may operate similarly to the CRC word generators shown in FIGS. 4A-4C, with the added functionality of generating the error correction syndrome values r0" and r1". Then, the error correction circuit 560 may use the completed error correction syndrome values to identify if an error is present. As mentioned above, if either r0" or r1" are 0, then no error correction is performed by the error correction circuit. If error mask r0" is "00000", then an XOR of the selected symbol is unchanged, while r1" being "00000" indicates the error is in the received CRC words r0 or r1, and thus the correction circuit may disregard this scenario, and there is no correction of the data bits. If both of the error correction syndrome values r0" and r1" are non-zero, the location of the set of data bits of the symbol containing the error is determined by performing the above-mentioned r1"/r0" to identify a 5 bit symbol position index x[0]-x[4] used to identify the symbol position containing the error. In FIG. 5A r1"/r0" is performed by calculating r1"·

$$\frac{1}{r0''}$$

by finding the bit-representation of the reciprocal of r0". In some embodiments, the conversion 520 may be done using a lookup table. Following this conversion, r1" may be multiplied 525 by $$\frac{1}{r0''}$$

using modulo reduction techniques to find the symbol position index x[0]-x[4] of the erroneous data word. As described above, the decimal representation of symbol position index x[0]-x[4] may be referred to below as pos, and continuing the above example, 1≤pos≤30.

Figure 5B:
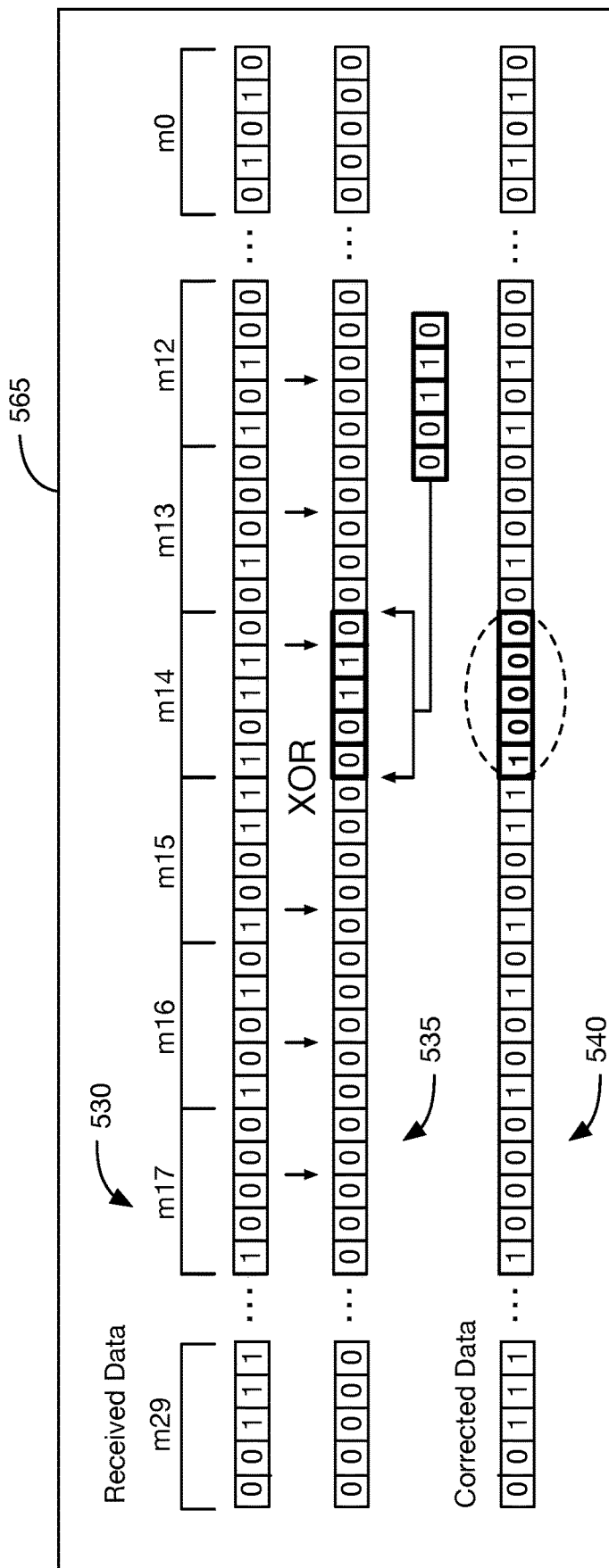

The bits x[0]-x[4] of the symbol position index, the bit error mask r0", and the sequential sets of data bits of the received data may be provided to a set of registers 565 to provide the error correction by altering a selected set of data bits. FIG. 5B illustrates a set of registers 565, in accordance with some embodiments. As shown, registers 565 include a first register 530 holding the sequential sets of data bits corresponding to received data. A second register 535 contains the bit error mask r0" used to correct a set of data bits of the received data in a position determined by the bits x[0]-x[4] of the symbol position index, and the rest of the second register 535 includes logic zero values so as to not alter any other bits of the received data. The first and second registers may be element-wise XOR'd in order to produce a corrected set of data in a third register 540, which may then be output from the system. In the example of FIG. 5B, the symbol position index identifies that the set of data bits corresponding to symbol m14 need to be corrected, and the received set of bits corresponding to symbol m14 are XOR'd with the bit error mask corresponding to error correction syndrome value r0".

As described above, a LUT may be implemented to find the reciprocal of r0". An example LUT performing such a function is given in Appendix C. Once the reciprocal of r0"

is obtained, it can be multiplied by r1" to obtain the values of x[0]-x[4] discussed above. The following logical circuit-based operation may perform such a multiplication, in some embodiments, where inv_r0" is the reciprocal (or multiplicative inverse) of r0" obtained using the LUT of Appendix C, the "&" symbol represents a logical AND, and the "s" symbol represents the logical XOR:

$$x[0]=\text{inv\_r0"}[0]\&r1"[0]\oplus(1)(\text{inv\_r0"}[4]\&r1"[1]\oplus\\(\text{inv\_r0"}[3]\&r1"[2]\oplus(1)(\text{inv\_r0"}[2]\&r1"[3]\oplus\\(\text{inv\_r0"}[1]\oplus\text{inv\_r0"}[4])\&r1"[4])));$$

$$x[1]=\text{inv\_r0"}[1]\&r1"[0]\oplus(\text{inv\_r0"}[0]\&r1"[1]\oplus\\(\text{inv\_r0"}[4]\&r1"[2]\oplus(\text{inv\_r0"}[3]\&r1"[3]\\\oplus\text{inv\_r0"}[2]\&r1"[4])));$$

$$x[2]=\text{inv\_r0"}[2]\&r1"[0]\oplus((\text{inv\_r0"}[1]\oplus\text{inv\_r0"}[4])\\\&r1"[1]\oplus((\text{inv\_r0"}[0]\oplus\text{inv\_r0"}[3])\&r1"[2]\oplus\\((\text{inv\_r0"}[2]\oplus\text{inv\_r0"}[4])\&r1"[3]\oplus(\text{inv\_r0"}[1]\oplus\\(\text{inv\_r0"}[3]\oplus\text{inv\_r0"}[4]))\&r1"[4])));$$

$$x[3]=\text{inv\_r0"}[3]\&r1"[0]\oplus(\text{inv\_r0"}[2]\&r1"[1]\oplus\\((\text{inv\_r0"}[1]\oplus\text{inv\_r0"}[4])\&r1"[2]\oplus((\text{inv\_r0"}[0]\\\oplus\text{inv\_r0"}[3])\&r1"[3]\oplus(\text{inv\_r0"}[2]\oplus\text{inv\_r0"}[4])\\\&r1"[4])));$$

$$x[4]=\text{inv\_r0"}[4]\&r1"[0]\oplus(\text{inv\_r0"}[3]\&r1"[1]\oplus\\(\text{inv\_r0"}[2]\&r1"[2]\oplus((\text{inv\_r0"}[1]\oplus\text{inv\_r0"}[4])\\\&r1"[3]\oplus(\text{inv\_r0"}[0]]\text{inv\_r0"}[3])\&r1"[4])));$$

The above computation and the associated LUT describe only one possible embodiment of the error correction circuit, and many alternative logic functions performing equivalently the same functions may be used. In some embodiments of the error correction circuit, the above may be implemented through the use of a physical logic circuit, while alternative embodiments may perform the calculations using software running on a processor.

Once the error correction circuit obtains the location pos-1 of the erroneous data word and the bit error mask r0", the error correction circuit aligns the error mask with the correct symbol in the received data 530, using e.g., registers, and perform an XOR operation. FIG. 5B illustrates a correction of symbol m14. As shown, the bit error mask r0" may be loaded into a location of a correction register 535, the location determined by a symbol position index associated with symbol m14. In at least one embodiment, the starting bit of the selected set of data bits corresponding to the erroneous data word may be the length of each received data word 'n' times the symbol position index (pos 1). Lastly, a data register 530 containing the 150 bits of received data and the correction register 535 including the bit error mask r0" and the rest logic zero values may be XOR'd together to obtain a set of corrected data bits 540, which may then be output from the system.

Figure 6:
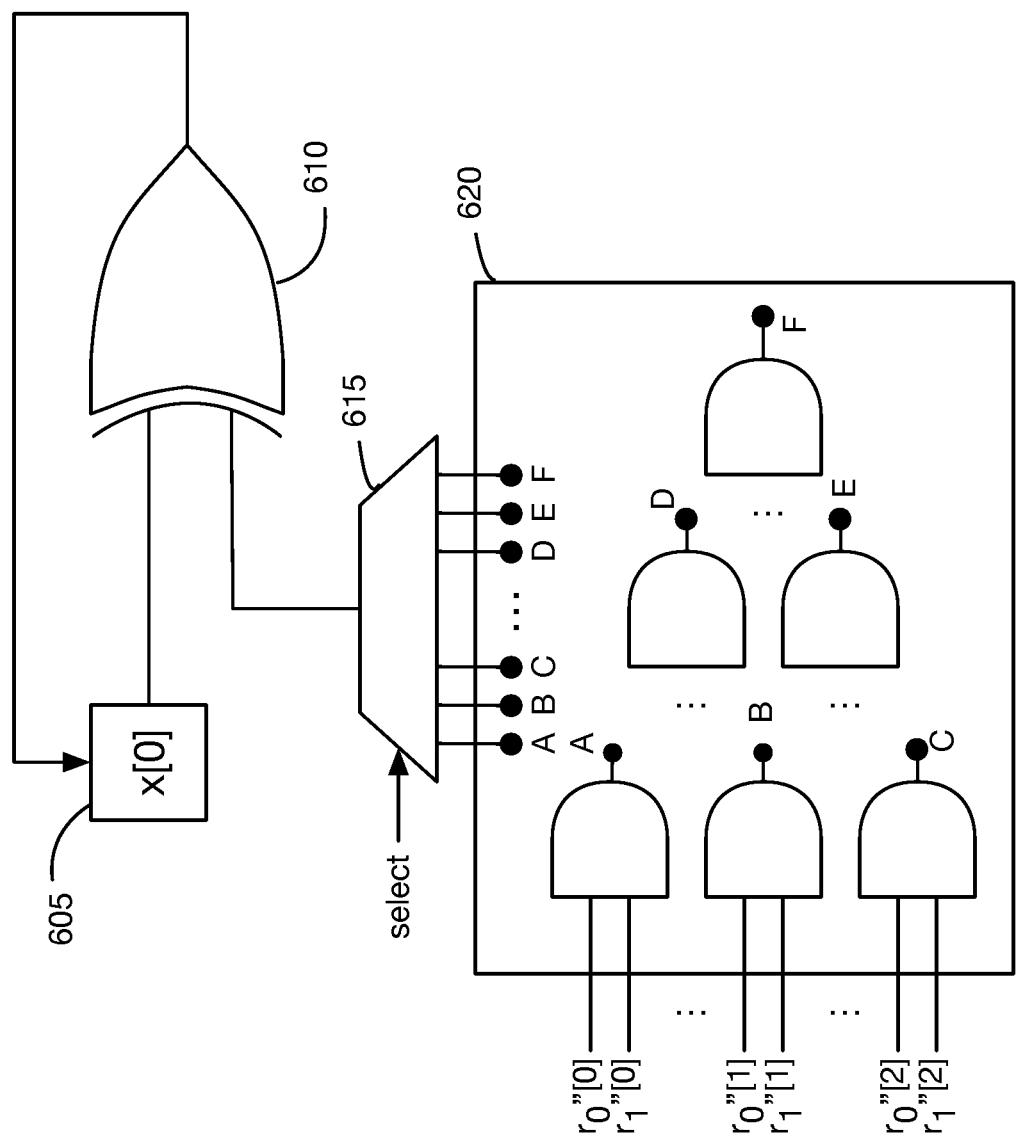
FIG. 6 is a block diagram for identifying an erroneous data word position, in accordance with some embodiments.

FIG. 6 illustrates one particular example of a logic circuit for implementing division block 515 of error correction circuit 560. As shown, the logic circuit is configured to calculate a portion x[k] of the symbol position index pos of the erroneous data word in accordance with some embodiments. As shown, FIG. 6 includes storage element 605 holding a current value, shown as x[0] in this example. The value x[0] is updated by XOR'ing 610 the current value of x[0] with a selected combination of bits of the error correction syndrome values r0" and r1". In some embodiments, the process is hard-coded using a multiplexor 615 connected to an AND gate network 620, and a selection signal (a simple count for example) incrementally selects a combination of bits of error correction syndrome values r0" and r1". In at least one embodiment, the sequence of logic combinations provided to the XOR gate 610 selected by the select signal to update x[0] may be pre-determined according to the incremental process of Appendix B. Further, a similar logic circuit may implement respective predetermined updating sequences for the other bits of index x[k] The logic circuit of FIG. 6 is simply one example of how a given bit of x[k] may be generated, there may be alternative circuit implementations that accomplish the same goal. Alternatively, a processor may run a software algorithm to implement the process of Appendix B.

Because some of the error correction processing occurs outside of deserialization, it is desirable to reduce the total delay caused by these operations as much as possible to minimize the impact on perceived latency. Such design optimization may be addressed using known art design automation tools. However, it may be beneficial to furnish such a tool with a good starting point for the search of a representation that minimizes the logic depth of the computation, and one suitable embodiment is given in Appendix B. Without further optimization, the logic depth of that embodiment is at most 7. Embodiments described above may be useful in correcting errors caused by bursts of energy hitting the wires of the multi-wire bus. For example, if a burst of electromagnetic energy hits one or more wires on the multi-wire bus, it could introduce one or more errors into bits of a decoded data word. These errors may be identified by a bit error mask at the output, the bit error mask used to correct the one or more bit errors in a selected erroneous data word identified by so-called error correction syndrome values.

Figure 3:
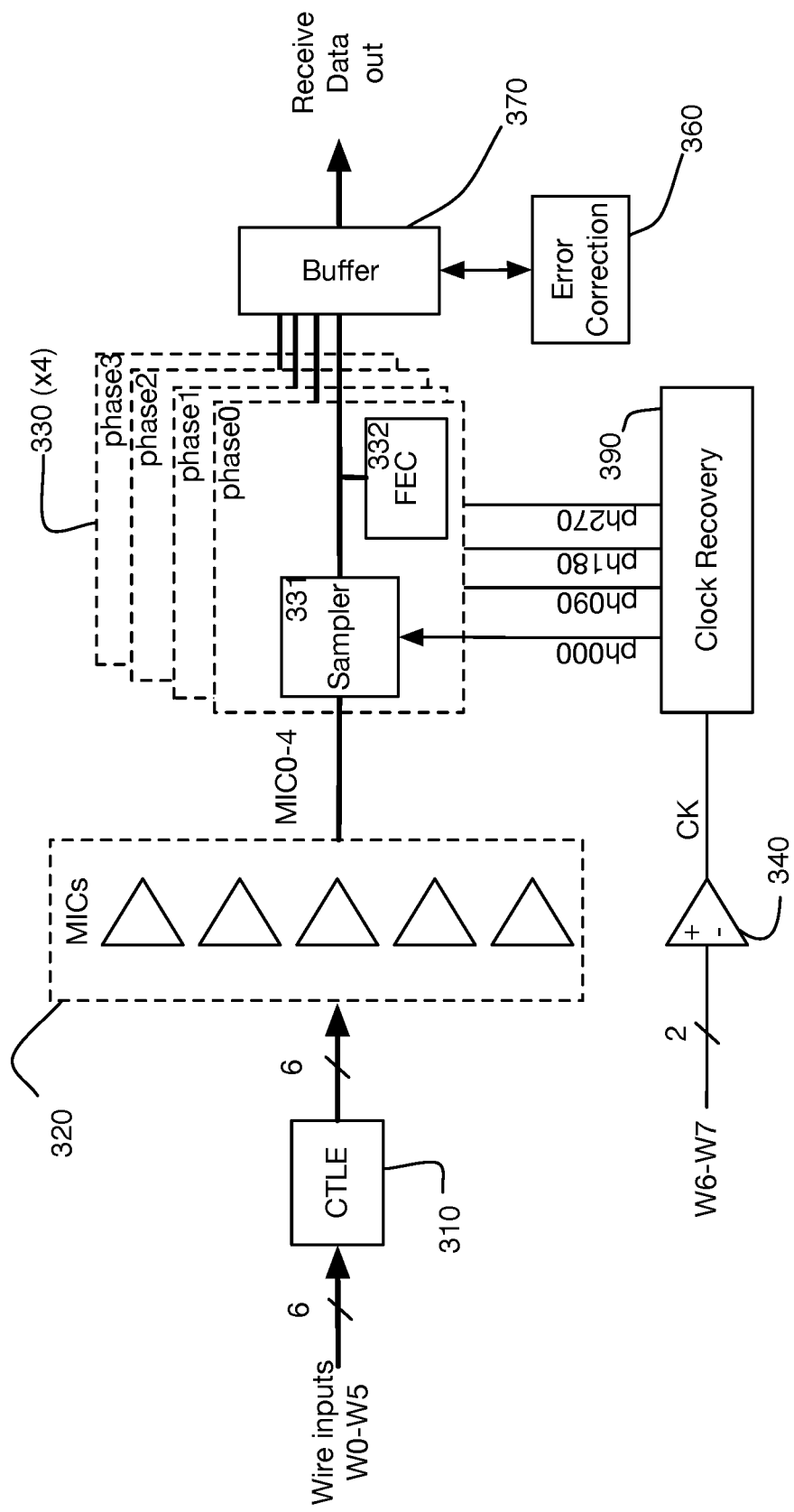
FIG. 3 shows one embodiment of a receiver incorporating the described Forward Error Correction in a data path utilizing multiple processing phases.

FIG. 3 illustrates a typical CNRZ-5 vector signal code receiver embodiment utilizing Multi-Input Comparators 320 to detect five data results MIC0-MIC 4 and one received clock CK. Wire signals $W_0$-$W_5$ are equalized by Continuous Time Linear Equalizer (CTLE) 310, and presented to the set of MICs 320 described by [Shokrollahi II], producing the detected data values MIC0-MIC4. Furthermore, wires $W_6$ and $W_7$ may also be equalized by CTLE 310 (not shown) As shown in FIG. 3, the set of MICs 320 includes five comparator circuits, each MIC corresponding to a linear amplifier circuit performing a linear combination of wire signals present on wires $W_0$-$W_5$ only, the wire signals corresponding to symbols of a vector signaling codeword of a vector signaling code. As described in [Shokrollahi II], each MIC may perform a respective linear combination defined by a respective sub-channel of a plurality of mutually orthogonal sub-channels, that may be defined by a receiver matrix. In FIG. 3 wires $W_6$ and $W_7$ are wires dedicated to carrying a differential clock signal, and differential comparator 340 operates on wires $W_6$ and $W_7$ to generate the received clock signal CK. Other embodiments may forego using dedicated wires $W_6$ and $W_7$ to carry a differential clock signal and may transmit a clock using a dedicated sub-channel of the aforementioned mutually orthogonal sub-channels, e.g., as output MIC4. Alternatively, a clock signal may be extracted using transition information from the detected data outputs MIC0-MIC4 (i.e., data-derived clock recovery).

The detected data values MIC0-MIC4 are presented to four processing phases 330, each of which processes the received data for one unit interval, and the received clock CK is presented to Clock Recovery 390, which in turn produces generates four sequential clock phases ph000, ph090, ph180, ph270 that collectively coordinates operation of processing phases 330. Within each processing phase, comparator outputs MIC0-MIC4 are Sampled 331 at the time determined by that phase's clock, producing sequential sets of five-bit words m0-m29 and received CRC words (r0 and r1) which are presented to Buffer 370. The receiver of FIG. 3 also includes an FEC check circuit 332 configured to incrementally update a plurality of error correction syndrome values based on each sequential set of data bits. In some embodiments, the plurality of error correction syndrome values are initialized to logic zero values, and FEC check circuit generates a set of n-bit local CRC words r0',r1' based on the received sequential sets of data bits, and forms n-bit error correction syndrome values (r0" and r1") upon decoding of a final vector signaling codeword by forming a comparison of the local CRC words r0', r1' to the received CRC words r0, r1. The error correction syndrome values r0" and r1" identify if an error is present. In alternative embodiments, the transmitter may transmit CRC words r0 and r1 first to initialize the plurality of error correction syndrome values and may subsequently transmit the plurality of sets of data bits. In such an embodiment, upon the decoding of the final vector signaling codeword, the plurality of error correction syndrome values r0" and r1" are complete, and thus the final comparison step may be omitted. As in the transmitter, receiver Buffer 370 accepts five bit received data values from processing phases 330 and assembles them into data words Receive Data Out. The receiver further includes an Error Correction circuit 360 configured to alter bits received in error within buffer 370 as described by the error correction algorithm of Appendix B. In some embodiments, in response to there being an error present, Error Correction circuit 360 generates a corrected set of data bits by correcting one or more errors in a selected set of data bits associated with a symbol position index determined from the plurality of error correction syndrome values, the one or more errors corrected using a bit error mask determined from a first error correction syndrome value r0".

Figure 7:
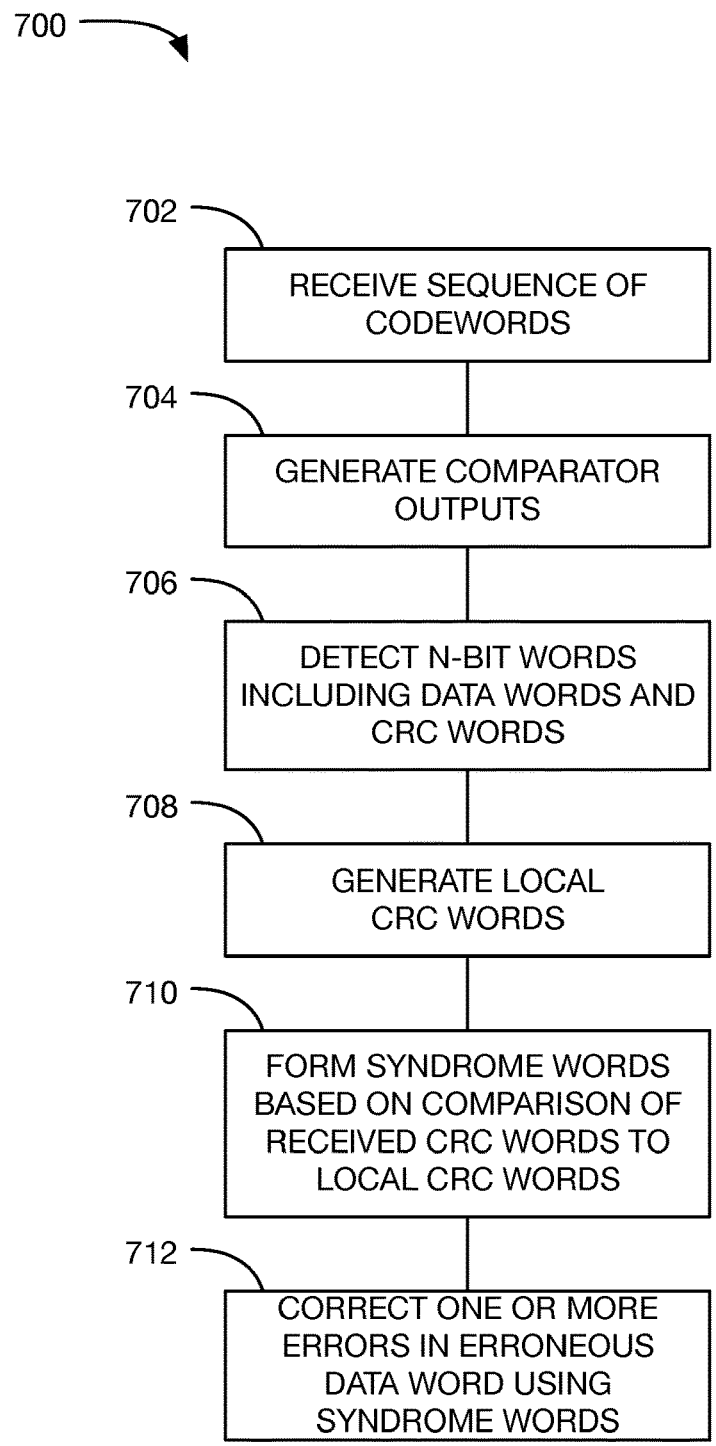
FIG. 7 is a flowchart of a method, in accordance with some embodiments.

FIG. 7 is a flowchart of a method 700, in accordance with some embodiments. As shown, method 700 includes receiving, at step 702, a sequence of codewords having m symbols, and responsively forming a plurality of sets of n comparator outputs at step 704, wherein n is an integer greater than or equal to 3. At step 706, the comparator outputs are sampled, and a plurality of n-bit words are detected 706, the plurality of n-bit words including data words and cyclic-redundancy check (CRC) words. At step 708, a set of n-bit local CRC words are generated based on the received data words. At step 710, n-bit syndrome words (e.g., the aforementioned error correction syndrome values) are formed based on (i) a set of local CRC calculations determined according to the received plurality of n-bit data words, and (ii) the received CRC words, the syndrome words identifying if an error is present. In response to an error being present, the method corrects 712 one or more errors in an erroneous data word having an index identified by a combination of the n-bit syndrome words, the one or more errors corrected using a bit error mask corresponding to one of the syndrome words.

In some embodiments, generating the local CRC words includes performing logical XOR functions on bits of the data words. In some embodiments, performing the logical XOR includes generating bits in position index i of a first local CRC word by XORing bits in position index i of each data word, wherein 0≤i≤n−1. In some embodiments, generating at least one local CRC word includes performing a modulo-reduced multiplication of each data word and a corresponding index of the data word, and recursively performing a logic XOR of each modulo-reduced multiplied data word.

In some embodiments, the set of local CRC words are updated recursively as each data word is received. Alternatively, the local CRC words may be generated subsequent to all of the data words being received.

In some embodiments, an error is present if each syndrome word is non-zero.

In some embodiments, identifying the index of the erroneous data word includes forming a binary reciprocal of the bit-error mask representing one of the syndrome words, and forming a modulo-reduced multiplication with a second syndrome word. In some embodiments, the binary reciprocal may be formed using a lookup table (LUT). In some embodiments, correcting the error comprises XORing the erroneous data word with the bit-error mask.

Figure 8:
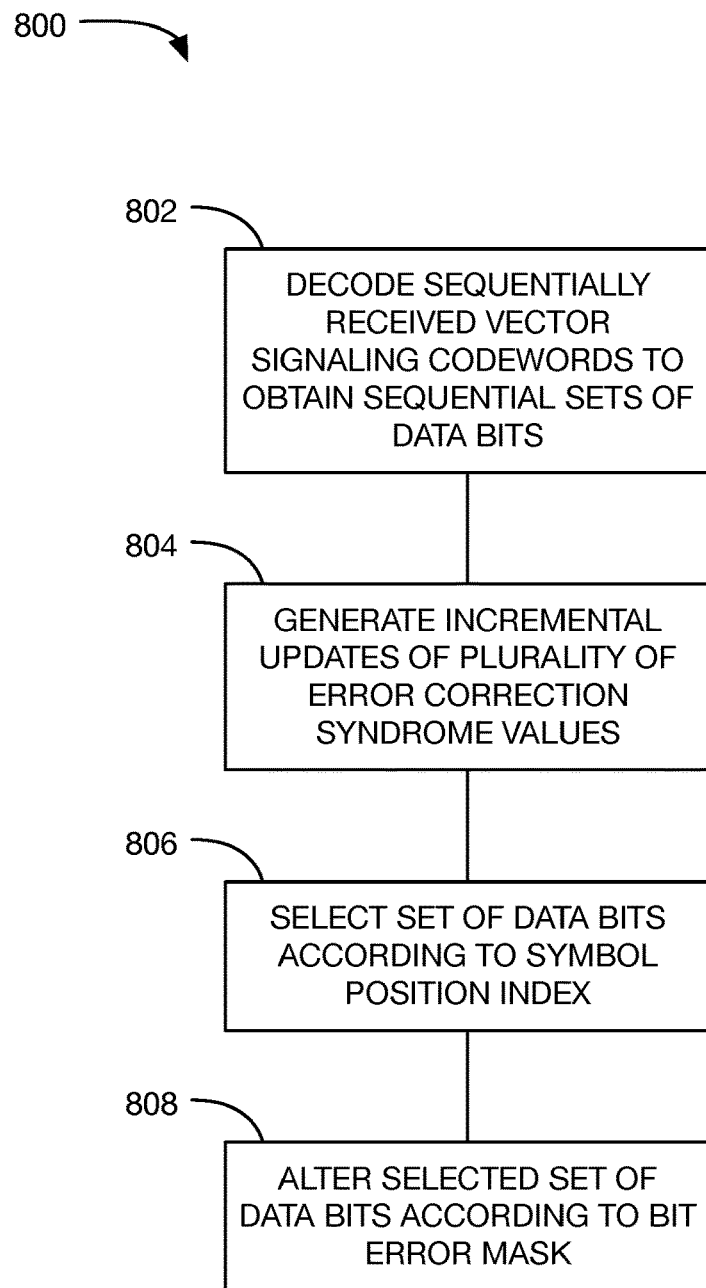
FIG. 8 is a flowchart of a method of iteratively updating error correction syndrome values, in accordance with some embodiments.

FIG. 8 is a flowchart of a method 800, in accordance with some embodiments. As shown, method 800 includes decoding 802, using a vector signal code receiver, a predetermined number of sequentially received vector signaling codewords to obtain sequential sets of data bits, wherein elements of each vector signaling codeword are received in parallel over a plurality of wires. Incremental updates of a plurality of error correction syndrome values are generated 804 by an FEC check circuit based on each sequential set of data bits according to a check matrix. Upon decoding of a final vector signaling codeword of the predetermined number of received vector signaling codewords and performing a final incremental update of the plurality of error correction syndrome values, data bits are modified within the sequential sets of data bits by selecting 806 a set of data bits from the sequential sets of data bits according to a symbol position index determined from the plurality of error correction syndrome values, and altering 808 the selected set of data bits according to a bit error mask determined from a first error correction syndrome value of the plurality of error correction syndrome values.

In some embodiments, generating the incremental updates of the plurality of error correction syndrome values includes performing a logical XOR operation on a previously-stored error correction syndrome value based on a given set of data bits. In some embodiments, the logical XOR operation is performed by performing a bit-wise XOR of the previously stored error correction syndrome value with the given set of data bits. Such an operation may be applicable when incrementally updating error correction syndrome values corresponding to r0". Alternatively, the logical XOR operation is performed by performing a logical XOR of the previously stored error correction syndrome value with bits determined by a CRC calculation corresponding to a result of a modulo-multiplication of the given set of data bits of a received data word mj with a binary expansion of symbol index integer j. Such an XOR operation may be applicable when incrementally updating error correction syndrome values corresponding to r1". For example, CRC calculation may include modulo-multiplying the 5-bit data word m13 by the 5-bit binary expansion of the integer j='13', the CRC calculation subsequently XOR'd with the previously stored 5 bit r1 error correction syndrome value may.

In some embodiments, the plurality of error correction syndrome values are initialized to logic zero values, and wherein performing the final incremental update of the plurality of error correction syndrome values includes comparing the plurality of error correction syndrome values to a plurality of received CRC words. Alternatively, the plurality of error correction syndrome values are initialized according to a plurality of received CRC words prior to generating the incremental updates of the plurality of error correction syndrome values.

In some embodiments, the symbol position index is determined by forming a binary reciprocal of the first error correction syndrome value, and forming a modulo-reduced multiplication with a second error correction syndrome value of the plurality of error correction syndrome values. In some embodiments, the binary reciprocal is formed using a lookup table (LUT), such as the LUT of Appendix C.

In some embodiments, the first error correction syndrome value is updated by performing a logical XOR function on bits of the sequential sets of data bits sharing a common bit position.

In some embodiments, the selected set of data bits is altered by performing a bit-wise XOR of the selected set of data bits with the bit error mask to create a corrected set of data bits. In some embodiments, the sequential sets of data bits are stored in a first register, and wherein the bit error mask is stored in a second register, and wherein the corrected set of data bits are stored in a third register. In such embodiments, the symbol position index may identify a location in the second register to store the bit error mask.

As will be well understood by one familiar with the art, the methods used to buffer and reformat data in transmitter and receiver may utilize a variety of known art methods, including storage in random access memory, in a collection of data latches, or FIFO buffer elements. Conversion between data words and transmission-unit-sized bit groups may be facilitated by digital multiplexors, shift registers or barrel shifters, or dual-ported memory structures, either as stand-alone elements or integrated with the aforementioned storage elements. As previously mentioned, data path widths described in the above examples are based on the descriptive example offered without limitation of CNRZ-5 transport, with other data path widths and transport media being equally applicable. Similarly, an example set of four processing phases was used without implying limitation for both transmitter and receiver; other embodiments may utilize more or fewer processing instances without limit, including a single instance.

Appendix a—Incremental Computation of r0, 1

One embodiment of the computation of r0 and r1 may be performed by execution of the following sequence of operations, which are organized such that consecutive elements of the transmitted data stream may be processed in transmit order and grouping, with the processing delay of those operations pipelined or overlapped with transmission.

In the descriptive notation below, r0[i] is bit i of r0, similarly r1[i] is bit i of r1. The notational sequence inp[ ] represents the input data being processed, wherein inp[0 . . . 4] are the bits of m0, inp[5 . . . 9] are the bits of m1, . . . , inp[145 . . . 149] are the bits of m29. $\oplus$ denotes the Boolean XOR operator.

```
r0 = 0; r1 = 0;
r0[0] = r0[0]⊕inp[0];
r1[0] = r1[0]⊕inp[0];
r0[1] = r0[1]⊕inp[1];
r1[1] = r1[1]⊕inp[1];
r0[2] = r0[2]⊕inp[2];
r1[2] = r1[2]⊕inp[2];
r0[3] = r0[3]⊕inp[3];
r1[3] = r1[3]⊕inp[3];
r0[4] = r0[4]⊕inp[4];
r1[4] = r1[4]⊕inp[4];
r0[0] = r0[0]⊕inp[5];
r1[1] = r1[1]⊕inp[5];
r1[2] = r1[2]⊕inp[5];
r1[4] = r1[4]⊕inp[5];
r0[1] = r0[1]⊕inp[6];
r1[0] = r1[0]⊕inp[6];
r1[1] = r1[1]⊕inp[6];
r1[3] = r1[3]⊕inp[6];
r1[4] = r1[4]⊕inp[6];
r0[2] = r0[2]⊕inp[7];
```

-continued

```
r1[1] = r1[1]⊕inp[7];
r1[2] = r1[2]⊕inp[7];
r1[3] = r1[3]⊕inp[7];
r0[3] = r0[3]⊕inp[8];
r1[2] = r1[2]⊕inp[8];
r0[4] = r0[4]⊕inp[9];
r1[3] = r1[3]⊕inp[9];
r0[0] = r0[0]⊕inp[10];
r1[0] = r1[0]⊕inp[10];
r1[1] = r1[1]⊕inp[10];
r1[2] = r1[2]⊕inp[10];
r1[4] = r1[4]⊕inp[10];
r0[1] = r0[1]⊕inp[11];
r1[0] = r1[0]⊕inp[11];
r1[3] = r1[3]⊕inp[11];
r1[4] = r1[4]⊕inp[11];
r0[2] = r0[2]⊕inp[12];
r1[1] = r1[1]⊕inp[12];
r1[3] = r1[3]⊕inp[12];
r0[3] = r0[3]⊕inp[13];
r1[2] = r1[2]⊕inp[13];
r1[3] = r1[3]⊕inp[13];
r0[4] = r0[4]⊕inp[14];
r1[3] = r1[3]⊕inp[14];
r1[4] = r1[4]⊕inp[14];
r0[0] = r0[0]⊕inp[15];
r1[0] = r1[0]⊕inp[15];
r1[2] = r1[2]⊕inp[15];
r1[3] = r1[3]⊕inp[15];
r1[4] = r1[4]⊕inp[15];
r0[1] = r0[1]⊕inp[16];
r1[0] = r1[0]⊕inp[16];
r0[2] = r0[2]⊕inp[17];
r1[0] = r1[0]⊕inp[17];
r1[4] = r1[4]⊕inp[17];
r0[3] = r0[3]⊕inp[18];
r1[1] = r1[1]⊕inp[18];
r1[2] = r1[2]⊕inp[18];
r1[3] = r1[3]⊕inp[18];
r0[4] = r0[4]⊕inp[19];
r1[2] = r1[2]⊕inp[19];
r0[0] = r0[0]⊕inp[20];
r1[2] = r1[2]⊕inp[20];
r1[3] = r1[3]⊕inp[20];
r1[4] = r1[4]⊕inp[20];
r0[1] = r0[1]⊕inp[21];
r1[0] = r1[0]⊕inp[21];
r1[1] = r1[1]⊕inp[21];
r0[2] = r0[2]⊕inp[22];
r1[0] = r1[0]⊕inp[22];
r1[2] = r1[2]⊕inp[22];
r1[4] = r1[4]⊕inp[22];
r0[3] = r0[3]⊕inp[23];
r1[1] = r1[1]⊕inp[23];
r1[2] = r1[2]⊕inp[23];
r0[4] = r0[4]⊕inp[24];
r1[2] = r1[2]⊕inp[24];
r1[4] = r1[4]⊕inp[24];
r0[0] = r0[0]⊕inp[25];
r1[0] = r1[0]⊕inp[25];
r1[1] = r1[1]⊕inp[25];
r1[3] = r1[3]⊕inp[25];
r0[1] = r0[1]⊕inp[26];
r1[1] = r1[1]⊕inp[26];
r1[3] = r1[3]⊕inp[26];
r1[4] = r1[4]⊕inp[26];
r0[2] = r0[2]⊕inp[27];
r1[0] = r1[0]⊕inp[27];
r1[1] = r1[1]⊕inp[27];
r1[2] = r1[2]⊕inp[27];
r1[3] = r1[3]⊕inp[27];
r1[4] = r1[4]⊕inp[27];
r0[3] = r0[3]⊕inp[28];
r1[1] = r1[1]⊕inp[28];
r1[3] = r1[3]⊕inp[28];
r0[4] = r0[4]⊕inp[29];
r1[2] = r1[2]⊕inp[29];
r1[3] = r1[3]⊕inp[29];
r0[0] = r0[0]⊕inp[30];
```

-continued

```
r1[1] = r1[1]⊕inp[30];
r1[3] = r1[3]⊕inp[30];
r0[1] = r0[1]⊕inp[31];
r1[3] = r1[3]⊕inp[31];
r1[4] = r1[4]⊕inp[31];
r0[2] = r0[2]⊕inp[32];
r1[0] = r1[0]⊕inp[32];
r1[1] = r1[1]⊕inp[32];
r1[3] = r1[3]⊕inp[32];
r1[4] = r1[4]⊕inp[32];
r0[3] = r0[3]⊕inp[33];
r1[1] = r1[1]⊕inp[33];
r0[4] = r0[4]⊕inp[34];
r1[2] = r1[2]⊕inp[34];
r1[3] = r1[3]⊕inp[34];
r1[4] = r1[4]⊕inp[34];
r0[0] = r0[0]⊕inp[35];
r1[2] = r1[2]⊕inp[35];
r1[4] = r1[4]⊕inp[35];
r0[1] = r0[1]⊕inp[36];
r1[1] = r1[1]⊕inp[36];
r1[2] = r1[2]⊕inp[36];
r1[4] = r1[4]⊕inp[36];
r0[2] = r0[2]⊕inp[37];
r1[1] = r1[1]⊕inp[37];
r1[2] = r1[2]⊕inp[37];
r1[3] = r1[3]⊕inp[37];
r1[4] = r1[4]⊕inp[37];
r0[3] = r0[3]⊕inp[38];
r1[0] = r1[0]⊕inp[38];
r1[4] = r1[4]⊕inp[38];
r0[4] = r0[4]⊕inp[39];
r1[1] = r1[1]⊕inp[39];
r1[2] = r1[2]⊕inp[39];
r1[3] = r1[3]⊕inp[39];
r0[0] = r0[0]⊕inp[40];
r1[0] = r1[0]⊕inp[40];
r1[2] = r1[2]⊕inp[40];
r1[4] = r1[4]⊕inp[40];
r0[1] = r0[1]⊕inp[41];
r1[2] = r1[2]⊕inp[41];
r1[4] = r1[4]⊕inp[41];
r0[2] = r0[2]⊕inp[42];
r1[1] = r1[1]⊕inp[42];
r1[3] = r1[3]⊕inp[42];
r1[4] = r1[4]⊕inp[42];
r0[3] = r0[3]⊕inp[43];
r1[0] = r1[0]⊕inp[43];
r1[3] = r1[3]⊕inp[43];
r1[4] = r1[4]⊕inp[43];
r0[4] = r0[4]⊕inp[44];
r1[1] = r1[1]⊕inp[44];
r1[2] = r1[2]⊕inp[44];
r1[3] = r1[3]⊕inp[44];
r1[4] = r1[4]⊕inp[44];
r0[0] = r0[0]⊕inp[45];
r1[1] = r1[1]⊕inp[45];
r0[1] = r0[1]⊕inp[46];
r1[0] = r1[0]⊕inp[46];
r1[2] = r1[2]⊕inp[46];
r1[3] = r1[3]⊕inp[46];
r0[2] = r0[2]⊕inp[47];
r1[4] = r1[4]⊕inp[47];
r0[3] = r0[3]⊕inp[48];
r1[0] = r1[0]⊕inp[48];
r1[2] = r1[2]⊕inp[48];
r1[4] = r1[4]⊕inp[48];
r0[4] = r0[4]⊕inp[49];
r1[1] = r1[1]⊕inp[49];
r1[2] = r1[2]⊕inp[49];
r0[0] = r0[0]⊕inp[50];
r1[0] = r1[0]⊕inp[50];
r1[1] = r1[1]⊕inp[50];
r0[1] = r0[1]⊕inp[51];
r1[0] = r1[0]⊕inp[51];
r1[1] = r1[1]⊕inp[51];
r1[2] = r1[2]⊕inp[51];
r1[3] = r1[3]⊕inp[51];
r0[2] = r0[2]⊕inp[52];
r1[2] = r1[2]⊕inp[52];
r1[4] = r1[4]⊕inp[52];
r0[3] = r0[3]⊕inp[53];
r1[0] = r1[0]⊕inp[53];
r1[2] = r1[2]⊕inp[53];
r1[3] = r1[3]⊕inp[53];
r1[4] = r1[4]⊕inp[53];
r0[4] = r0[4]⊕inp[54];
r1[1] = r1[1]⊕inp[54];
r1[2] = r1[2]⊕inp[54];
r1[4] = r1[4]⊕inp[54];
r0[0] = r0[0]⊕inp[55];
r1[0] = r1[0]⊕inp[55];
r1[3] = r1[3]⊕inp[55];
r0[1] = r0[1]⊕inp[56];
r1[0] = r1[0]⊕inp[56];
r1[1] = r1[1]⊕inp[56];
r1[2] = r1[2]⊕inp[56];
r1[4] = r1[4]⊕inp[56];
r0[2] = r0[2]⊕inp[57];
r1[0] = r1[0]⊕inp[57];
r1[1] = r1[1]⊕inp[57];
r1[2] = r1[2]⊕inp[57];
r1[3] = r1[3]⊕inp[57];
r0[3] = r0[3]⊕inp[58];
r1[0] = r1[0]⊕inp[58];
r1[1] = r1[1]⊕inp[58];
r1[2] = r1[2]⊕inp[58];
r1[3] = r1[3]⊕inp[58];
r1[4] = r1[4]⊕inp[58];
r0[4] = r0[4]⊕inp[59];
r1[1] = r1[1]⊕inp[59];
r1[3] = r1[3]⊕inp[59];
r0[0] = r0[0]⊕inp[60];
r1[3] = r1[3]⊕inp[60];
r0[1] = r0[1]⊕inp[61];
r1[0] = r1[0]⊕inp[61];
r1[2] = r1[2]⊕inp[61];
r1[4] = r1[4]⊕inp[61];
r0[2] = r0[2]⊕inp[62];
r1[0] = r1[0]⊕inp[62];
r1[1] = r1[1]⊕inp[62];
r1[3] = r1[3]⊕inp[62];
r0[3] = r0[3]⊕inp[63];
r1[0] = r1[0]⊕inp[63];
r1[1] = r1[1]⊕inp[63];
r1[2] = r1[2]⊕inp[63];
r1[4] = r1[4]⊕inp[63];
r0[4] = r0[4]⊕inp[64];
r1[1] = r1[1]⊕inp[64];
r1[3] = r1[3]⊕inp[64];
r1[4] = r1[4]⊕inp[64];
r0[0] = r0[0]⊕inp[65];
r1[0] = r1[0]⊕inp[65];
r1[1] = r1[1]⊕inp[65];
r1[2] = r1[2]⊕inp[65];
r1[3] = r1[3]⊕inp[65];
r1[4] = r1[4]⊕inp[65];
r0[1] = r0[1]⊕inp[66];
r1[2] = r1[2]⊕inp[66];
r1[3] = r1[3]⊕inp[66];
r0[2] = r0[2]⊕inp[67];
r1[0] = r1[0]⊕inp[67];
r0[3] = r0[3]⊕inp[68];
r1[0] = r1[0]⊕inp[68];
r1[1] = r1[1]⊕inp[68];
r1[3] = r1[3]⊕inp[68];
r1[4] = r1[4]⊕inp[68];
r0[4] = r0[4]⊕inp[69];
r1[1] = r1[1]⊕inp[69];
r0[0] = r0[0]⊕inp[70];
r1[1] = r1[1]⊕inp[70];
r1[2] = r1[2]⊕inp[70];
r1[3] = r1[3]⊕inp[70];
r1[4] = r1[4]⊕inp[70];
r0[1] = r0[1]⊕inp[71];
r1[1] = r1[1]⊕inp[71];
r1[2] = r1[2]⊕inp[71];
r1[3] = r1[3]⊕inp[71];
```

```
r0[2] = r0[2]⊕inp[72];
r1[0] = r1[0]⊕inp[72];
r1[2] = r1[2]⊕inp[72];
r0[3] = r0[3]⊕inp[73];
r1[0] = r1[0]⊕inp[73];
r1[1] = r1[1]⊕inp[73];
r1[4] = r1[4]⊕inp[73];
r0[4] = r0[4]⊕inp[74];
r1[1] = r1[1]⊕inp[74];
r1[4] = r1[4]⊕inp[74];
r0[0] = r0[0]⊕inp[75];
r1[1] = r1[1]⊕inp[75];
r1[2] = r1[2]⊕inp[75];
r0[1] = r0[1]⊕inp[76];
r1[0] = r1[0]⊕inp[76];
r1[2] = r1[2]⊕inp[76];
r1[3] = r1[3]⊕inp[76];
r1[4] = r1[4]⊕inp[76];
r0[2] = r0[2]⊕inp[77];
r1[0] = r1[0]⊕inp[77];
r1[3] = r1[3]⊕inp[77];
r1[4] = r1[4]⊕inp[77];
r0[3] = r0[3]⊕inp[78];
r1[1] = r1[1]⊕inp[78];
r1[2] = r1[2]⊕inp[78];
r1[3] = r1[3]⊕inp[78];
r1[4] = r1[4]⊕inp[78];
r0[4] = r0[4]⊕inp[79];
r1[0] = r1[0]⊕inp[79];
r1[4] = r1[4]⊕inp[79];
r0[0] = r0[0]⊕inp[80];
r1[0] = r1[0]⊕inp[80];
r1[1] = r1[1]⊕inp[80];
r1[2] = r1[2]⊕inp[80];
r0[1] = r0[1]⊕inp[81];
r1[0] = r1[0]⊕inp[81];
r1[1] = r1[1]⊕inp[81];
r1[2] = r1[2]⊕inp[81];
r1[3] = r1[3]⊕inp[81];
r1[4] = r1[4]⊕inp[81];
r0[2] = r0[2]⊕inp[82];
r1[0] = r1[0]⊕inp[82];
r1[2] = r1[2]⊕inp[82];
r1[3] = r1[3]⊕inp[82];
r1[4] = r1[4]⊕inp[82];
r0[3] = r0[3]⊕inp[83];
r1[1] = r1[1]⊕inp[83];
r1[2] = r1[2]⊕inp[83];
r1[4] = r1[4]⊕inp[83];
r0[4] = r0[4]⊕inp[84];
r1[0] = r1[0]⊕inp[84];
r0[0] = r0[0]⊕inp[85];
r1[4] = r1[4]⊕inp[85];
r0[1] = r0[1]⊕inp[86];
r1[1] = r1[1]⊕inp[86];
r1[2] = r1[2]⊕inp[86];
r0[2] = r0[2]⊕inp[87];
r1[0] = r1[0]⊕inp[87];
r1[1] = r1[1]⊕inp[87];
r1[2] = r1[2]⊕inp[87];
r1[4] = r1[4]⊕inp[87];
r0[3] = r0[3]⊕inp[88];
r1[1] = r1[1]⊕inp[88];
r1[3] = r1[3]⊕inp[88];
r1[4] = r1[4]⊕inp[88];
r0[4] = r0[4]⊕inp[89];
r1[0] = r1[0]⊕inp[89];
r1[3] = r1[3]⊕inp[89];
r1[4] = r1[4]⊕inp[89];
r0[0] = r0[0]⊕inp[90];
r1[0] = r1[0]⊕inp[90];
r1[4] = r1[4]⊕inp[90];
r0[1] = r0[1]⊕inp[91];
r1[2] = r1[2]⊕inp[91];
r0[2] = r0[2]⊕inp[92];
r1[0] = r1[0]⊕inp[92];
r1[1] = r1[1]⊕inp[92];
r1[4] = r1[4]⊕inp[92];
r0[3] = r0[3]⊕inp[93];
r1[1] = r1[1]⊕inp[93];
r1[4] = r1[4]⊕inp[93];
r0[4] = r0[4]⊕inp[94];
r1[0] = r1[0]⊕inp[94];
r1[3] = r1[3]⊕inp[94];
r0[0] = r0[0]⊕inp[95];
r1[0] = r1[0]⊕inp[95];
r1[1] = r1[1]⊕inp[95];
r1[3] = r1[3]⊕inp[95];
r1[4] = r1[4]⊕inp[95];
r0[1] = r0[1]⊕inp[96];
r1[2] = r1[2]⊕inp[96];
r1[3] = r1[3]⊕inp[96];
r1[4] = r1[4]⊕inp[96];
r0[2] = r0[2]⊕inp[97];
r1[3] = r1[3]⊕inp[97];
r0[3] = r0[3]⊕inp[98];
r1[4] = r1[4]⊕inp[98];
r0[4] = r0[4]⊕inp[99];
r1[0] = r1[0]⊕inp[99];
r1[2] = r1[2]⊕inp[99];
r1[4] = r1[4]⊕inp[99];
r0[0] = r0[0]⊕inp[100];
r1[1] = r1[1]⊕inp[100];
r1[3] = r1[3]⊕inp[100];
r1[4] = r1[4]⊕inp[100];
r0[1] = r0[1]⊕inp[101];
r1[1] = r1[1]⊕inp[101];
r1[2] = r1[2]⊕inp[101];
r1[3] = r1[3]⊕inp[101];
r1[4] = r1[4]⊕inp[101];
r0[2] = r0[2]⊕inp[102];
r1[2] = r1[2]⊕inp[102];
r1[3] = r1[3]⊕inp[102];
r0[3] = r0[3]⊕inp[103];
r1[3] = r1[3]⊕inp[103];
r1[4] = r1[4]⊕inp[103];
r0[4] = r0[4]⊕inp[104];
r1[0] = r1[0]⊕inp[104];
r1[2] = r1[2]⊕inp[104];
r0[0] = r0[0]⊕inp[105];
r1[0] = r1[0]⊕inp[105];
r1[2] = r1[2]⊕inp[105];
r1[3] = r1[3]⊕inp[105];
r0[1] = r0[1]⊕inp[106];
r1[0] = r1[0]⊕inp[106];
r1[1] = r1[1]⊕inp[106];
r1[2] = r1[2]⊕inp[106];
r0[2] = r0[2]⊕inp[107];
r1[1] = r1[1]⊕inp[107];
r1[2] = r1[2]⊕inp[107];
r0[3] = r0[3]⊕inp[108];
r1[2] = r1[2]⊕inp[108];
r1[4] = r1[4]⊕inp[108];
r0[4] = r0[4]⊕inp[109];
r1[0] = r1[0]⊕inp[109];
r1[2] = r1[2]⊕inp[109];
r1[3] = r1[3]⊕inp[109];
r1[4] = r1[4]⊕inp[109];
r0[0] = r0[0]⊕inp[110];
r1[2] = r1[2]⊕inp[110];
r1[3] = r1[3]⊕inp[110];
r0[1] = r0[1]⊕inp[111];
r1[0] = r1[0]⊕inp[111];
r1[2] = r1[2]⊕inp[111];
r0[2] = r0[2]⊕inp[112];
r1[1] = r1[1]⊕inp[112];
r0[3] = r0[3]⊕inp[113];
r1[2] = r1[2]⊕inp[113];
r1[3] = r1[3]⊕inp[113];
r1[4] = r1[4]⊕inp[113];
r0[4] = r0[4]⊕inp[114];
r1[0] = r1[0]⊕inp[114];
r1[2] = r1[2]⊕inp[114];
r1[3] = r1[3]⊕inp[114];
r0[0] = r0[0]⊕inp[115];
r1[1] = r1[1]⊕inp[115];
r1[4] = r1[4]⊕inp[115];
r0[1] = r0[1]⊕inp[116];
```

```
r1[0] = r1[0]⊕inp[116];
r1[1] = r1[1]⊕inp[116];
r1[3] = r1[3]⊕inp[116];
r0[2] = r0[2]⊕inp[117];
r1[0] = r1[0]⊕inp[117];
r1[1] = r1[1]⊕inp[117];
r1[2] = r1[2]⊕inp[117];
r0[3] = r0[3]⊕inp[118];
r1[0] = r1[0]⊕inp[118];
r1[1] = r1[1]⊕inp[118];
r1[2] = r1[2]⊕inp[118];
r1[3] = r1[3]⊕inp[118];
r0[4] = r0[4]⊕inp[119];
r1[0] = r1[0]⊕inp[119];
r1[1] = r1[1]⊕inp[119];
r1[2] = r1[2]⊕inp[119];
r1[3] = r1[3]⊕inp[119];
r1[4] = r1[4]⊕inp[119];
r0[0] = r0[0]⊕inp[120];
r1[0] = r1[0]⊕inp[120];
r1[1] = r1[1]⊕inp[120];
r1[4] = r1[4]⊕inp[120];
r0[1] = r0[1]⊕inp[121];
r1[0] = r1[0]⊕inp[121];
r1[3] = r1[3]⊕inp[121];
r0[2] = r0[2]⊕inp[122];
r1[0] = r1[0]⊕inp[122];
r1[1] = r1[1]⊕inp[122];
r0[3] = r0[3]⊕inp[123];
r1[0] = r1[0]⊕inp[123];
r1[1] = r1[1]⊕inp[123];
r1[2] = r1[2]⊕inp[123];
r0[4] = r0[4]⊕inp[124];
r1[0] = r1[0]⊕inp[124];
r1[1] = r1[1]⊕inp[124];
r1[2] = r1[2]⊕inp[124];
r1[3] = r1[3]⊕inp[124];
r0[0] = r0[0]⊕inp[125];
r1[0] = r1[0]⊕inp[125];
r1[2] = r1[2]⊕inp[125];
r0[1] = r0[1]⊕inp[126];
r1[4] = r1[4]⊕inp[126];
r0[2] = r0[2]⊕inp[127];
r1[0] = r1[0]⊕inp[127];
r1[3] = r1[3]⊕inp[127];
r0[3] = r0[3]⊕inp[128];
r1[0] = r1[0]⊕inp[128];
r1[1] = r1[1]⊕inp[128];
r1[3] = r1[3]⊕inp[128];
r0[4] = r0[4]⊕inp[129];
r1[0] = r1[0]⊕inp[129];
r1[1] = r1[1]⊕inp[129];
r1[2] = r1[2]⊕inp[129];
r1[4] = r1[4]⊕inp[129];
r0[0] = r0[0]⊕inp[130];
r1[0] = r1[0]⊕inp[130];
r1[2] = r1[2]⊕inp[130];
r0[1] = r0[1]⊕inp[131];
r1[1] = r1[1]⊕inp[131];
r1[4] = r1[4]⊕inp[131];
r0[2] = r0[2]⊕inp[132];
r1[0] = r1[0]⊕inp[132];
r1[2] = r1[2]⊕inp[132];
r1[3] = r1[3]⊕inp[132];
r0[3] = r0[3]⊕inp[133];
r1[0] = r1[0]⊕inp[133];
r1[1] = r1[1]⊕inp[133];
r0[4] = r0[4]⊕inp[134];
r1[0] = r1[0]⊕inp[134];
r1[1] = r1[1]⊕inp[134];
r1[2] = r1[2]⊕inp[134];
r0[0] = r0[0]⊕inp[135];
r1[0] = r1[0]⊕inp[135];
r1[1] = r1[1]⊕inp[135];
r1[2] = r1[2]⊕inp[135];
r0[1] = r0[1]⊕inp[136];
r1[1] = r1[1]⊕inp[136];
r1[3] = r1[3]⊕inp[136];
r0[2] = r0[2]⊕inp[137];
r1[1] = r1[1]⊕inp[137];
r1[2] = r1[2]⊕inp[137];
r1[4] = r1[4]⊕inp[137];
r0[3] = r0[3]⊕inp[138];
r1[0] = r1[0]⊕inp[138];
r0[4] = r0[4]⊕inp[139];
r1[0] = r1[0]⊕inp[139];
r1[1] = r1[1]⊕inp[139];
r1[3] = r1[3]⊕inp[139];
r1[4] = r1[4]⊕inp[139];
r0[0] = r0[0]⊕inp[140];
r1[1] = r1[1]⊕inp[140];
r1[2] = r1[2]⊕inp[140];
r1[3] = r1[3]⊕inp[140];
r0[1] = r0[1]⊕inp[141];
r1[3] = r1[3]⊕inp[141];
r0[2] = r0[2]⊕inp[142];
r1[1] = r1[1]⊕inp[142];
r1[4] = r1[4]⊕inp[142];
r0[3] = r0[3]⊕inp[143];
r1[0] = r1[0]⊕inp[143];
r1[3] = r1[3]⊕inp[143];
r0[4] = r0[4]⊕inp[144];
r1[0] = r1[0]⊕inp[144];
r1[1] = r1[1]⊕inp[144];
r1[3] = r1[3]⊕inp[144];
r0[0] = r0[0]⊕inp[145];
r1[0] = r1[0]⊕inp[145];
r1[3] = r1[3]⊕inp[145];
r1[4] = r1[4]⊕inp[145];
r0[1] = r0[1]⊕inp[146];
r1[0] = r1[0]⊕inp[146];
r1[4] = r1[4]⊕inp[146];
r0[2] = r0[2]⊕inp[147];
r1[3] = r1[3]⊕inp[147];
r1[4] = r1[4]⊕inp[147];
r0[3] = r0[3]⊕inp[148];
r1[0] = r1[0]⊕inp[148];
r1[2] = r1[2]⊕inp[148];
r0[4] = r0[4]⊕inp[149];
r1[0] = r1[0]⊕inp[149];
r1[1] = r1[1]⊕inp[149];
r1[4] = r1[4]⊕inp[149];
```

Appendix B—Error Correction

Given a nonzero element of the finite field GF(32) in its 5-bit representation r0"[0], . . . , r0"[4] and another element r1"[0], . . . , r1"[4], the following procedure computes the bit representation of the element x=r1"/r0" in GF(32), that is, the bits x[0], . . . , x[4]. In the notation used below, ⊕ denotes the Boolean XOR and & the Boolean AND operator.

```
x[0]=r0"[0]&r1"[0];
x[0]=x[0]⊕(r0"[0]&r1"[3]);
x[0]=x[0]⊕(r0"[1]&r1"[1]);
x[0]=x[0]⊕(r0"[1]&r1"[2]);
x[0]=x[0]⊕(r0"[1]&r1"[3]);
x[0]=x[0]⊕(r0"[2]&r1"[1]);
x[0]=x[0]⊕(r0"[2]&r1"[2]);
x[0]=x[0]⊕(r0"[3]&r1"[1]);
x[0]=x[0]⊕(r0"[3]&r1"[3]);
x[0]=x[0]⊕(r0"[4]&r1"[0]);
x[0]=x[0]⊕(r0"[4]&r1"[4]);
x[0]=x[0]⊕(r0"[0]&r0"[1]&r1"[1]);
x[0]=x[0]⊕(r0"[0]&r0"[1]&r1"[4]);
x[0]=x[0]⊕(r0"[0]&r0"[2]&r1"[0]);
x[0]=x[0]⊕(r0"[0]&r0"[2]&r1"[4]);
x[0]=x[0]⊕(r0"[0]&r0"[3]&r1"[0]);
x[0]=x[0]⊕(r0"[0]&r0"[3]&r1"[3]);
x[0]=x[0]⊕(r0"[0]&r0"[3]&r1"[4]);
x[0]=x[0]⊕(r0"[0]&r0"[4]&r1"[0]);
x[0]=x[0]⊕(r0"[0]&r0"[4]&r1"[1]);
x[0]=x[0]⊕(r0"[0]&r0"[4]&r1"[4]);
x[0]=x[0]⊕(r0"[1]&r0"[2]&r1"[1]);
``` x[0]=x[0]⊕(r0"[1]&r0"[2]&r1"[3]);
x[0]=x[0]⊕(r0"[1]&r0"[3]&r1"[0]);
x[0]=x[0]⊕(r0"[1]&r0"[3]&r1"[1]);
x[0]=x[0]⊕(r0"[1]&r0"[3]&r1"[2]);
x[0]=x[0]⊕(r0"[1]&r0"[4]&r1"[1]);
x[0]=x[0]⊕(r0"[2]&r0"[3]&r1"[0]);
x[0]=x[0]⊕(r0"[2]&r0"[3]&r1"[3]);
x[0]=x[0]⊕(r0"[2]&r0"[4]&r1"[4]);
x[0]=x[0]⊕(r0"[3]&r0"[4]&r1"[2]);
x[0]=x[0]⊕(r0"[3]&r0"[4]&r1"[4]);
x[0]=x[0]⊕(r0"[0]&r0"[1]&r0"[2]&r1"[2]);
x[0]=x[0]⊕(r0"[0]&r0"[1]&r0"[3]&r1"[0]);
x[0]=x[0]⊕(r0"[0]&r0"[1]&r0"[3]&r1"[1]);
x[0]=x[0]⊕(r0"[0]&r0"[1]&r0"[3]&r1"[4]);
x[0]=x[0]⊕(r0"[0]&r0"[1]&r0"[4]&r1"[1]);
x[0]=x[0]⊕(r0"[0]&r0"[1]&r0"[4]&r1"[3]);
x[0]=x[0]⊕(r0"[0]&r0"[2]&r0"[3]&r1"[2]);
x[0]=x[0]⊕(r0"[0]&r0"[2]&r0"[3]&r1"[3]);
x[0]=x[0]⊕(r0"[0]&r0"[2]&r0"[3]&r1"[4]);
x[0]=x[0]⊕(r0"[0]&r0"[2]&r0"[4]&r1"[0]);
x[0]=x[0]⊕(r0"[0]&r0"[2]&r0"[4]&r1"[2]);
x[0]=x[0]⊕(r0"[0]&r0"[2]&r0"[4]&r1"[3]);
x[0]=x[0]⊕(r0"[0]&r0"[3]&r0"[4]&r1"[0]);
x[0]=x[0]⊕(r0"[0]&r0"[3]&r0"[4]&r1"[2]);
x[0]=x[0]⊕(r0"[0]&r0"[3]&r0"[4]&r1"[4]);
x[0]=x[0]⊕(r0"[1]&r0"[2]&r0"[3]&r1"[0]);
x[0]=x[0]⊕(r0"[1]&r0"[2]&r0"[3]&r1"[2]);
x[0]=x[0]⊕(r0"[1]&r0"[2]&r0"[3]&r1"[4]);
x[0]=x[0]⊕(r0"[1]&r0"[2]&r0"[4]&r1"[0]);
x[0]=x[0]⊕(r0"[1]&r0"[2]&r0"[4]&r1"[1]);
x[0]=x[0]⊕(r0"[1]&r0"[2]&r0"[4]&r1"[2]);
x[0]=x[0]⊕(r0"[1]&r0"[2]&r0"[4]&r1"[4]);
x[0]=x[0]⊕(r0"[1]&r0"[3]&r0"[4]&r1"[0]);
x[0]=x[0]⊕(r0"[1]&r0"[3]&r0"[4]&r1"[3]);
x[0]=x[0]⊕(r0"[2]&r0"[3]&r0"[4]&r1"[2]);
x[0]=x[0]⊕(r0"[2]&r0"[3]&r0"[4]&r1"[3]);
x[0]=x[0]⊕(r0"[0]&r0"[1]&r0"[2]&r0"[3]&r1" [4]);
x[0]=x[0]⊕(r0"[0]&r0"[1]&r0"[2]&r0"[4]&r1" [3]);
x[0]=x[0]⊕(r0"[0]&r0"[1]&r0"[3]&r0"[4]&r1" [2]);
x[0]=x[0]⊕(r0"[0]&r0"[2]&r0"[3]&r0"[4]&r1" [1]);
x[0]=x[0]⊕(r0"[1]&r0"[2]&r0"[3]&r0"[4]&r1" [0]);
x[1]=r0"[0]&r1"[1];
x[1]=x[1]⊕(r0"[0]&r1"[2]);
x[1]=x[1]⊕(r0"[0]&r1"[4]);
x[1]=x[1]⊕(r0"[1]&r1"[2]);
x[1]=x[1]⊕(r0"[1]&r1"[4]);
x[1]=x[1]⊕(r0"[2]&r1"[0]);
x[1]=x[1]⊕(r0"[2]&r1"[1]);
x[1]=x[1]⊕(r0"[2]&r1"[4]);
x[1]=x[1]⊕(r0"[3]&r1"[1]);
x[1]=x[1]⊕(r0"[3]&r1"[2]);
x[1]=x[1]⊕(r0"[4]&r1"[1]);
x[1]=x[1]⊕(r0"[4]&r1"[3]);
x[1]=x[1]⊕(r0"[0]&r0"[1]&r1"[1]);
x[1]=x[1]⊕(r0"[0]&r0"[1]&r1"[3]);
x[1]=x[1]⊕(r0"[0]&r0"[1]&r1"[4]);
x[1]=x[1]⊕(r0"[0]&r0"[2]&r1"[1]);
x[1]=x[1]⊕(r0"[0]&r0"[2]&r1"[3]);
x[1]=x[1]⊕(r0"[0]&r0"[3]&r1"[0]);
x[1]=x[1]⊕(r0"[0]&r0"[3]&r1"[2]);
x[1]=x[1]⊕(r0"[0]&r0"[3]&r1"[3]);
x[1]=x[1]⊕(r0"[0]&r0"[4]&r1"[0]);
x[1]=x[1]⊕(r0"[0]&r0"[4]&r1"[1]);
x[1]=x[1]⊕(r0"[0]&r0"[4]&r1"[3]);
x[1]=x[1]⊕(r0"[1]&r0"[2]&r1"[1]);
x[1]=x[1]⊕(r0"[1]&r0"[2]&r1"[2]);
x[1]=x[1]⊕(r0"[1]&r0"[3]&r1"[1]);

x[1]=x[1]⊕(r0"[1]&r0"[4]&r1"[0]);
x[1]=x[1]⊕(r0"[2]&r0"[3]&r1"[1]);
x[1]=x[1]⊕(r0"[2]&r0"[3]&r1"[2]);
x[1]=x[1]⊕(r0"[2]&r0"[3]&r1"[4]);
x[1]=x[1]⊕(r0"[2]&r0"[4]&r1"[0]);
x[1]=x[1]⊕(r0"[2]&r0"[4]&r1"[1]);
x[1]=x[1]⊕(r0"[2]&r0"[4]&r1"[3]);
x[1]=x[1]⊕(r0"[2]&r0"[4]&r1"[4]);
x[1]=x[1]⊕(r0"[3]&r0"[4]&r1"[0]);
x[1]=x[1]⊕(r0"[3]&r0"[4]&r1"[3]);
x[1]=x[1]⊕(r0"[0]&r0"[1]&r0"[2]&r1"[1]);
x[1]=x[1]⊕(r0"[0]&r0"[1]&r0"[2]&r1"[4]);
x[1]=x[1]⊕(r0"[0]&r0"[1]&r0"[3]&r1"[0]);
x[1]=x[1]⊕(r0"[0]&r0"[1]&r0"[3]&r1"[1]);
x[1]=x[1]⊕(r0"[0]&r0"[1]&r0"[3]&r1"[3]);
x[1]=x[1]⊕(r0"[0]&r0"[1]&r0"[4]&r1"[1]);
x[1]=x[1]⊕(r0"[0]&r0"[1]&r0"[4]&r1"[2]);
x[1]=x[1]⊕(r0"[0]&r0"[2]&r0"[3]&r1"[1]);
x[1]=x[1]⊕(r0"[0]&r0"[2]&r0"[3]&r1"[2]);
x[1]=x[1]⊕(r0"[0]&r0"[2]&r0"[3]&r1"[3]);
x[1]=x[1]⊕(r0"[0]&r0"[2]&r0"[4]&r1"[2]);
x[1]=x[1]⊕(r0"[0]&r0"[3]&r0"[4]&r1"[3]);
x[1]=x[1]⊕(r0"[0]&r0"[3]&r0"[4]&r1"[4]);
x[1]=x[1]⊕(r0"[1]&r0"[2]&r0"[3]&r1"[3]);
x[1]=x[1]⊕(r0"[1]&r0"[2]&r0"[3]&r1"[4]);
x[1]=x[1]⊕(r0"[1]&r0"[2]&r0"[4]&r1"[0]);
x[1]=x[1]⊕(r0"[1]&r0"[2]&r0"[4]&r1"[3]);
x[1]=x[1]⊕(r0"[1]&r0"[2]&r0"[4]&r1"[4]);
x[1]=x[1]⊕(r0"[1]&r0"[3]&r0"[4]&r1"[1]);
x[1]=x[1]⊕(r0"[1]&r0"[3]&r0"[4]&r1"[2]);
x[1]=x[1]⊕(r0"[1]&r0"[3]&r0"[4]&r1"[4]);
x[1]=x[1]⊕(r0"[2]&r0"[3]&r0"[4]&r1"[0]);
x[1]=x[1]⊕(r0"[2]&r0"[3]&r0"[4]&r1"[2]);
x[1]=x[1]⊕(r0"[2]&r0"[3]&r0"[4]&r1"[4]);
x[1]=x[1]⊕(r0"[0]&r0"[1]&r0"[2]&r0"[3]&r1" [0]);
x[1]=x[1]⊕(r0"[0]&r0"[1]&r0"[2]&r0"[3]&r1" [1]);
x[1]=x[1]⊕(r0"[0]&r0"[1]&r0"[2]&r0"[3]&r1" [3]);
x[1]=x[1]⊕(r0"[0]&r0"[1]&r0"[2]&r0"[3]&r1" [4]);
x[1]=x[1]⊕(r0"[0]&r0"[1]&r0"[2]&r0"[4]&r1" [0]);
x[1]=x[1]⊕(r0"[0]&r0"[1]&r0"[2]&r0"[4]&r1" [1]);
x[1]=x[1]⊕(r0"[0]&r0"[1]&r0"[2]&r0"[4]&r1" [2]);
x[1]=x[1]⊕(r0"[0]&r0"[1]&r0"[3]&r0"[4]&r1" [1]);
x[1]=x[1]⊕(r0"[0]&r0"[1]&r0"[3]&r0"[4]&r1" [4]);
x[1]=x[1]⊕(r0"[0]&r0"[2]&r0"[3]&r0"[4]&r1" [0]);
x[1]=x[1]⊕(r0"[1]&r0"[2]&r0"[3]&r0"[4]&r1" [0]);
x[1]=x[1]⊕(r0"[1]&r0"[2]&r0"[3]&r0"[4]&r1" [4]);
x[2]=r0"[0]&r1"[3];
x[2]=x[2]⊕(r0"[1]&r1"[0]);
x[2]=x[2]⊕(r0"[1]&r1"[3]);
x[2]=x[2]⊕(r0"[2]&r1"[0]);
x[2]=x[2]⊕(r0"[2]&r1"[1]);
x[2]=x[2]⊕(r0"[2]&r1"[3]);
x[2]=x[2]⊕(r0"[3]&r1"[0]);
x[2]=x[2]⊕(r0"[3]&r1"[1]);
x[2]=x[2]⊕(r0"[3]&r1"[4]);
x[2]=x[2]⊕(r0"[4]&r1"[1]);
x[2]=x[2]⊕(r0"[4]&r1"[2]);
x[2]=x[2]⊕(r0"[0]&r0"[1]&r1"[0]);
x[2]=x[2]⊕(r0"[0]&r0"[1]&r1"[2]);
x[2]=x[2]⊕(r0"[0]&r0"[1]&r1"[3]);
x[2]=x[2]⊕(r0"[0]&r0"[1]&r1"[4]);
x[2]=x[2]⊕(r0"[0]&r0"[2]&r1"[1]);
x[2]=x[2]⊕(r0"[0]&r0"[2]&r1"[2]);
x[2]=x[2]⊕(r0"[0]&r0"[3]&r1"[2]);
x[2]=x[2]⊕(r0"[0]&r0"[4]&r1"[0]);
x[2]=x[2]⊕(r0"[0]&r0"[4]&r1"[1]);
x[2]=x[2]⊕(r0"[0]&r0"[4]&r1"[2]);

x[2]=x[2]⊕(r0"[0]&r0"[4]&r1"[4]);
x[2]=x[2]⊕(r0"[1]&r0"[2]&r1"[0]);
x[2]=x[2]⊕(r0"[1]&r0"[2]&r1"[1]);
x[2]=x[2]⊕(r0"[1]&r0"[2]&r1"[4]);
x[2]=x[2]⊕(r0"[1]&r0"[3]&r1"[0]);
x[2]=x[2]⊕(r0"[1]&r0"[4]&r1"[0]);
x[2]=x[2]⊕(r0"[1]&r0"[4]&r1"[4]);
x[2]=x[2]⊕(r0"[2]&r0"[3]&r1"[3]);
x[2]=x[2]⊕(r0"[2]&r0"[4]&r1"[2]);
x[2]=x[2]⊕(r0"[2]&r0"[4]&r1"[3]);
x[2]=x[2]⊕(r0"[3]&r0"[4]&r1"[1]);
x[2]=x[2]⊕(r0"[3]&r0"[4]&r1"[2]);
x[2]=x[2]⊕(r0"[3]&r0"[4]&r1"[4]);
x[2]=x[2]⊕(r0"[0]&r0"[1]&r0"[2]&r1"[1]);
x[2]=x[2]⊕(r0"[0]&r0"[1]&r0"[2]&r1"[3]);
x[2]=x[2]⊕(r0"[0]&r0"[1]&r0"[2]&r1"[4]);
x[2]=x[2]⊕(r0"[0]&r0"[1]&r0"[3]&r1"[0]);
x[2]=x[2]⊕(r0"[0]&r0"[1]&r0"[3]&r1"[1]);
x[2]=x[2]⊕(r0"[0]&r0"[1]&r0"[3]&r1"[2]);
x[2]=x[2]⊕(r0"[0]&r0"[1]&r0"[3]&r1"[4]);
x[2]=x[2]⊕(r0"[0]&r0"[1]&r0"[4]&r1"[0]);
x[2]=x[2]⊕(r0"[0]&r0"[1]&r0"[4]&r1"[1]);
x[2]=x[2]⊕(r0"[0]&r0"[1]&r0"[4]&r1"[4]);
x[2]=x[2]⊕(r0"[0]&r0"[2]&r0"[3]&r1"[2]);
x[2]=x[2]⊕(r0"[0]&r0"[2]&r0"[3]&r1"[4]);
x[2]=x[2]⊕(r0"[0]&r0"[2]&r0"[4]&r1"[1]);
x[2]=x[2]⊕(r0"[0]&r0"[2]&r0"[4]&r1"[4]);
x[2]=x[2]⊕(r0"[0]&r0"[3]&r0"[4]&r1"[2]);
x[2]=x[2]⊕(r0"[0]&r0"[3]&r0"[4]&r1"[3]);
x[2]=x[2]⊕(r0"[0]&r0"[3]&r0"[4]&r1"[4]);
x[2]=x[2]⊕(r0"[1]&r0"[2]&r0"[3]&r1"[2]);
x[2]=x[2]⊕(r0"[1]&r0"[2]&r0"[3]&r1"[3]);
x[2]=x[2]⊕(r0"[1]&r0"[2]&r0"[3]&r1"[4]);
x[2]=x[2]⊕(r0"[1]&r0"[2]&r0"[4]&r1"[0]);
x[2]=x[2]⊕(r0"[1]&r0"[2]&r0"[4]&r1"[2]);
x[2]=x[2]⊕(r0"[1]&r0"[2]&r0"[4]&r1"[3]);
x[2]=x[2]⊕(r0"[1]&r0"[3]&r0"[4]&r1"[3]);
x[2]=x[2]⊕(r0"[2]&r0"[3]&r0"[4]&r1"[3]);
x[2]=x[2]⊕(r0"[2]&r0"[3]&r0"[4]&r1"[4]);
x[2]=x[2]⊕(r0"[0]&r0"[1]&r0"[2]&r0"[3]&r1" [2]);
x[2]=x[2]⊕(r0"[0]&r0"[1]&r0"[2]&r0"[3]&r1" [3]);
x[2]=x[2]⊕(r0"[0]&r0"[1]&r0"[2]&r0"[4]&r1" [1]);
x[2]=x[2]⊕(r0"[0]&r0"[1]&r0"[3]&r0"[4]&r1" [1]);
x[2]=x[2]⊕(r0"[0]&r0"[1]&r0"[3]&r0"[4]&r1" [3]);
x[2]=x[2]⊕(r0"[0]&r0"[1]&r0"[3]&r0"[4]&r1" [4]);
x[2]=x[2]⊕(r0"[0]&r0"[2]&r0"[3]&r0"[4]&r1" [0]);
x[2]=x[2]⊕(r0"[0]&r0"[2]&r0"[3]&r0"[4]&r1" [4]);
x[2]=x[2]⊕(r0"[1]&r0"[2]&r0"[3]&r0"[4]&r1" [1]);
x[2]=x[2]⊕(r0"[1]&r0"[2]&r0"[3]&r0"[4]&r1" [3]);
x[3]=r0"[0]&r1"[1];
x[3]=x[3]⊕(r0"[0]&r1"[2]);
x[3]=x[3]⊕(r0"[0]&r1"[3]);
x[3]=x[3]⊕(r0"[1]&r1"[3]);
x[3]=x[3]⊕(r0"[1]&r1"[4]);
x[3]=x[3]⊕(r0"[2]&r1"[0]);
x[3]=x[3]⊕(r0"[2]&r1"[4]);
x[3]=x[3]⊕(r0"[3]&r1"[0]);
x[3]=x[3]⊕(r0"[4]&r1"[1]);
x[3]=x[3]⊕(r0"[0]&r0"[1]&r1"[0]);
x[3]=x[3]⊕(r0"[0]&r0"[1]&r1"[2]);
x[3]=x[3]⊕(r0"[0]&r0"[1]&r1"[3]);
x[3]=x[3]⊕(r0"[0]&r0"[2]&r1"[1]);
x[3]=x[3]⊕(r0"[0]&r0"[3]&r1"[0]);
x[3]=x[3]⊕(r0"[0]&r0"[3]&r1"[1]);
x[3]=x[3]⊕(r0"[0]&r0"[3]&r1"[3]);
x[3]=x[3]⊕(r0"[0]&r0"[4]&r1"[1]);
x[3]=x[3]⊕(r0"[0]&r0"[4]&r1"[3]);

x[3]=x[3]⊕(r0"[1]&r0"[2]&r1"[0]);
x[3]=x[3]⊕(r0"[1]&r0"[3]&r1"[1]);
x[3]=x[3]⊕(r0"[1]&r0"[3]&r1"[2]);
x[3]=x[3]⊕(r0"[1]&r0"[3]&r1"[4]);
x[3]=x[3]⊕(r0"[1]&r0"[4]&r1"[3]);
x[3]=x[3]⊕(r0"[2]&r0"[3]&r1"[1]);
x[3]=x[3]⊕(r0"[2]&r0"[3]&r1"[2]);
x[3]=x[3]⊕(r0"[2]&r0"[3]&r1"[3]);
x[3]=x[3]⊕(r0"[2]&r0"[4]&r1"[0]);
x[3]=x[3]⊕(r0"[2]&r0"[4]&r1"[2]);
x[3]=x[3]⊕(r0"[3]&r0"[4]&r1"[2]);
x[3]=x[3]⊕(r0"[3]&r0"[4]&r1"[3]);
x[3]=x[3]⊕(r0"[3]&r0"[4]&r1"[4]);
x[3]=x[3]⊕(r0"[0]&r0"[1]&r0"[2]&r1"[0]);
x[3]=x[3]⊕(r0"[0]&r0"[1]&r0"[2]&r1"[3]);
x[3]=x[3]⊕(r0"[0]&r0"[1]&r0"[2]&r1"[4]);
x[3]=x[3]⊕(r0"[0]&r0"[1]&r0"[3]&r1"[1]);
x[3]=x[3]⊕(r0"[0]&r0"[1]&r0"[3]&r1"[3]);
x[3]=x[3]⊕(r0"[0]&r0"[1]&r0"[4]&r1"[0]);
x[3]=x[3]⊕(r0"[0]&r0"[2]&r0"[3]&r1"[0]);
x[3]=x[3]⊕(r0"[0]&r0"[2]&r0"[3]&r1"[2]);
x[3]=x[3]⊕(r0"[0]&r0"[2]&r0"[3]&r1"[4]);
x[3]=x[3]⊕(r0"[0]&r0"[2]&r0"[4]&r1"[0]);
x[3]=x[3]⊕(r0"[0]&r0"[2]&r0"[4]&r1"[1]);
x[3]=x[3]⊕(r0"[0]&r0"[2]&r0"[4]&r1"[2]);
x[3]=x[3]⊕(r0"[0]&r0"[2]&r0"[4]&r1"[4]);
x[3]=x[3]⊕(r0"[0]&r0"[3]&r0"[4]&r1"[0]);
x[3]=x[3]⊕(r0"[0]&r0"[3]&r0"[4]&r1"[1]);
x[3]=x[3]⊕(r0"[0]&r0"[3]&r0"[4]&r1"[3]);
x[3]=x[3]⊕(r0"[0]&r0"[3]&r0"[4]&r1"[4]);
x[3]=x[3]⊕(r0"[1]&r0"[2]&r0"[3]&r1"[0]);
x[3]=x[3]⊕(r0"[1]&r0"[2]&r0"[3]&r1"[1]);
x[3]=x[3]⊕(r0"[1]&r0"[2]&r0"[3]&r1"[3]);
x[3]=x[3]⊕(r0"[1]&r0"[2]&r0"[3]&r1"[4]);
x[3]=x[3]⊕(r0"[1]&r0"[2]&r0"[4]&r1"[0]);
x[3]=x[3]⊕(r0"[1]&r0"[2]&r0"[4]&r1"[1]);
x[3]=x[3]⊕(r0"[1]&r0"[2]&r0"[4]&r1"[4]);
x[3]=x[3]⊕(r0"[1]&r0"[3]&r0"[4]&r1"[1]);
x[3]=x[3]⊕(r0"[1]&r0"[3]&r0"[4]&r1"[2]);
x[3]=x[3]⊕(r0"[1]&r0"[3]&r0"[4]&r1"[3]);
x[3]=x[3]⊕(r0"[2]&r0"[3]&r0"[4]&r1"[4]);
x[3]=x[3]⊕(r0"[0]&r0"[1]&r0"[2]&r0"[3]&r1"[0]);
x[3]=x[3]⊕(r0"[0]&r0"[1]&r0"[2]&r0"[3]&r1"[2]);
x[3]=x[3]⊕(r0"[0]&r0"[1]&r0"[2]&r0"[4]&r1" [0]);
x[3]=x[3]⊕(r0"[0]&r0"[1]&r0"[2]&r0"[4]&r1" [3]);
x[3]=x[3]⊕(r0"[0]&r0"[1]&r0"[3]&r0"[4]&r1" [0]);
x[3]=x[3]⊕(r0"[0]&r0"[1]&r0"[3]&r0"[4]&r1"[3]);
x[3]=x[3]⊕(r0"[0]&r0"[1]&r0"[3]&r0"[4]&r1" [4]);
x[3]=x[3]⊕(r0"[0]&r0"[2]&r0"[3]&r0"[4]&r1" [3]);
x[3]=x[3]⊕(r0"[1]&r0"[2]&r0"[3]&r0"[4]&r1" [0]);
x[3]=x[3]⊕(r0"[1]&r0"[2]&r0"[3]&r0"[4]&r1"[1]);
x[3]=x[3]⊕(r0"[1]&r0"[2]&r0"[3]&r0"[4]&r1"[2]);
x[4]=r0"[0]&r1"[2];
x[4]=x[4]⊕(r0"[0]&r1"[4]);
x[4]=x[4]⊕(r0"[1]&r1"[2]);
x[4]=x[4]⊕(r0"[1]&r1"[3]);
x[4]=x[4]⊕(r0"[1]&r1"[4]);
x[4]=x[4]⊕(r0"[2]&r1"[1]);
x[4]=x[4]⊕(r0"[2]&r1"[3]);
x[4]=x[4]⊕(r0"[3]&r1"[0]);
x[4]=x[4]⊕(r0"[3]&r1"[4]);
x[4]=x[4]⊕(r0"[4]&r1"[0]);
x[4]=x[4]⊕(r0"[0]&r0"[1]&r1"[2]);
x[4]=x[4]⊕(r0"[0]&r0"[2]&r1"[0]);
x[4]=x[4]⊕(r0"[0]&r0"[3]&r1"[0]);
x[4]=x[4]⊕(r0"[0]&r0"[3]&r1"[1]);
x[4]=x[4]⊕(r0"[0]&r0"[3]&r1"[2]);

x[4]=x[4]⊕(r0"[0]&r0"[3]&r1"[4]);
x[4]=x[4]⊕(r0"[0]&r0"[4]&r1"[1]);
x[4]=x[4]⊕(r0"[0]&r0"[4]&r1"[2]);
x[4]=x[4]⊕(r0"[1]&r0"[2]&r1"[0]);
x[4]=x[4]⊕(r0"[1]&r0"[2]&r1"[4]);
x[4]=x[4]⊕(r0"[1]&r0"[3]&r1"[3]);
x[4]=x[4]⊕(r0"[1]&r0"[4]&r1"[0]);
x[4]=x[4]⊕(r0"[1]&r0"[4]&r1"[1]);
x[4]=x[4]⊕(r0"[1]&r0"[4]&r1"[2]);
x[4]=x[4]⊕(r0"[2]&r0"[3]&r1"[2]);
x[4]=x[4]⊕(r0"[2]&r0"[3]&r1"[4]);
x[4]=x[4]⊕(r0"[2]&r0"[4]&r1"[0]);
x[4]=x[4]⊕(r0"[2]&r0"[4]&r1"[1]);
x[4]=x[4]⊕(r0"[3]&r0"[4]&r1"[1]);
x[4]=x[4]⊕(r0"[3]&r0"[4]&r1"[2]);
x[4]=x[4]⊕(r0"[3]&r0"[4]&r1"[3]);
x[4]=x[4]⊕(r0"[0]&r0"[1]&r0"[2]&r1"[0]);
x[4]=x[4]⊕(r0"[0]&r0"[1]&r0"[2]&r1"[2]);
x[4]=x[4]⊕(r0"[0]&r0"[1]&r0"[2]&r1"[3]);
x[4]=x[4]⊕(r0"[0]&r0"[1]&r0"[3]&r1"[1]);
x[4]=x[4]⊕(r0"[0]&r0"[1]&r0"[3]&r1"[2]);
x[4]=x[4]⊕(r0"[0]&r0"[1]&r0"[4]&r1"[0]);
x[4]=x[4]⊕(r0"[0]&r0"[1]&r0"[4]&r1"[4]);
x[4]=x[4]⊕(r0"[0]&r0"[2]&r0"[3]&r1"[3]);
x[4]=x[4]⊕(r0"[0]&r0"[2]&r0"[3]&r1"[4]);
x[4]=x[4]⊕(r0"[0]&r0"[2]&r0"[4]&r1"[0]);
x[4]=x[4]⊕(r0"[0]&r0"[2]&r0"[4]&r1"[3]);
x[4]=x[4]⊕(r0"[0]&r0"[2]&r0"[4]&r1"[4]);
x[4]=x[4]⊕(r0"[0]&r0"[3]&r0"[4]&r1"[2]);
x[4]=x[4]⊕(r0"[0]&r0"[3]&r0"[4]&r1"[3]);
x[4]=x[4]⊕(r0"[1]&r0"[2]&r0"[3]&r1"[2]);
x[4]=x[4]⊕(r0"[1]&r0"[2]&r0"[3]&r1"[3]);
x[4]=x[4]⊕(r0"[1]&r0"[2]&r0"[4]&r1"[0]);
x[4]=x[4]⊕(r0"[1]&r0"[2]&r0"[4]&r1"[1]);
x[4]=x[4]⊕(r0"[1]&r0"[2]&r0"[4]&r1"[3]);
x[4]=x[4]⊕(r0"[1]&r0"[3]&r0"[4]&r1"[2]);
x[4]=x[4]⊕(r0"[1]&r0"[3]&r0"[4]&r1"[4]);
x[4]=x[4]⊕(r0"[2]&r0"[3]&r0"[4]&r1"[0]);
x[4]=x[4]⊕(r0"[2]&r0"[3]&r0"[4]&r1"[1]);
x[4]=x[4]⊕(r0"[2]&r0"[3]&r0"[4]&r1"[3]);
x[4]=x[4]⊕(r0"[2]&r0"[3]&r0"[4]&r1"[4]);
x[4]=x[4]⊕(r0"[0]&r0"[1]&r0"[2]&r0"[3]&r1" [0]);
x[4]=x[4]⊕(r0"[0]&r0"[1]&r0"[2]&r0"[3]&r1" [1]);
x[4]=x[4]⊕(r0"[0]&r0"[1]&r0"[2]&r0"[4]&r1" [1]);
x[4]=x[4]⊕(r0"[0]&r0"[1]&r0"[2]&r0"[4]&r1" [2]);
x[4]=x[4]⊕(r0"[0]&r0"[1]&r0"[2]&r0"[4]&r1" [4]);
x[4]=x[4]⊕(r0"[0]&r0"[1]&r0"[3]&r0"[4]&r1" [0]);
x[4]=x[4]⊕(r0"[0]&r0"[1]&r0"[3]&r0"[4]&r1" [2]);
x[4]=x[4]⊕(r0"[0]&r0"[1]&r0"[3]&r0"[4]&r1" [3]);
x[4]=x[4]⊕(r0"[0]&r0"[2]&r0"[3]&r0"[4]&r1" [0]);
x[4]=x[4]⊕(r0"[0]&r0"[2]&r0"[3]&r0"[4]&r1" [1]);
x[4]=x[4]⊕(r0"[0]&r0"[2]&r0"[3]&r0"[4]&r1" [2]);
x[4]=x[4]⊕(r0"[1]&r0"[2]&r0"[3]&r0"[4]&r1" [1]);

APPENDIX C

Inverse Lookup Table

| r0" | 1/r0" |
|---|---|
| 00000 | 00000 |
| 00001 | 00001 |
| 00010 | 10010 |
| 00011 | 11100 |
| 00100 | 01001 |
| 00101 | 10111 |
| 00110 | 01110 |
| 00111 | 01100 |

APPENDIX C-continued

Inverse Lookup Table

| r0" | 1/r0" |
|---|---|
| 01000 | 10110 |
| 01001 | 00100 |
| 01010 | 11001 |
| 01011 | 10000 |
| 01100 | 00111 |
| 01101 | 01111 |
| 01110 | 00110 |
| 01111 | 01101 |
| 10000 | 01011 |
| 10001 | 11000 |
| 10010 | 00010 |
| 10011 | 11101 |
| 10100 | 11110 |
| 10101 | 11010 |
| 10110 | 01000 |
| 10111 | 00101 |
| 11000 | 10001 |
| 11001 | 01010 |
| 11010 | 10101 |
| 11011 | 11111 |
| 11100 | 00011 |
| 11101 | 10011 |
| 11110 | 10100 |
| 11111 | 11011 |

The invention claimed is:

1. A method comprising:
generating, using a vector signal code receiver, a plurality of linear combinations of wire signals present on a plurality of wires to decode a predetermined number of sequentially received vector signaling codewords to obtain (i) sequential sets of data bits and (ii) two multi-bit error correction check words, wherein elements of each vector signaling codeword correspond to the wire signals and are received in parallel over the plurality of wires, wherein each linear combination of the plurality of linear combinations is defined by a respective sub-channel of a plurality of mutually orthogonal sub-channels;
generating, using a forward error correction (FEC) check circuit, an incremental update of two multi-bit error correction syndrome values based on each sequential set of data bits according to a check matrix, wherein each bit of a first multi-bit error correction syndrome value of the two multi-bit error correction syndrome values is incrementally updated using bits from corresponding bit positions in each set of data bits of the sequential sets of data bits;
upon decoding of a final vector signaling codeword of the predetermined number of received vector signaling codewords, performing a final incremental update of the two multi-bit error correction syndrome values, the final incremental update including bitwise-comparisons of each multi-bit error correction syndrome value to a respective multi-bit error correction check word of the two multi-bit error correction check words;
selecting a set of data bits from the sequential sets of data bits according to a symbol position index determined from a combination of the two multi-bit error correction syndrome values; and
altering the selected set of data bits according to a bit error mask corresponding to the first multi-bit error correction syndrome value of the two multi-bit error correction syndrome values.

2. The method of claim 1, wherein generating the incremental updates of the two multi-bit error correction syndrome values comprises performing a logical XOR operation on a previously-stored multi-bit error correction syndrome value based on a given set of data bits of the sequential sets of data bits.

3. The method of claim 1, wherein the two multi-bit error correction syndrome values are initialized to logic zero values.

4. The method of claim 1, wherein the two error correction syndrome values are initialized according to the multi-bit error correction check words prior to generating the incremental updates of the two multi-bit error correction syndrome values.

5. The method of claim 1, wherein the symbol position index is determined by forming a binary reciprocal of the first multi-bit error correction syndrome value, and forming a modulo-reduced multiplication with a second multi-bit error correction syndrome value of the two multi-bit error correction syndrome values.

6. The method of claim 5, wherein the binary reciprocal is formed using a lookup table (LUT).

7. The method of claim 1, wherein the first multi-bit error correction syndrome value is updated by performing a logical XOR function on the bits from the corresponding bit positions in the sequential sets of data bits sharing a common bit position.

8. The method of claim 1, wherein the selected set of data bits is altered by performing a bit-wise XOR of the selected set of data bits with the bit error mask to create a corrected set of data bits.

9. The method of claim 8, wherein the sequential sets of data bits are stored in a first register, and wherein the bit error mask is stored in a second register, and wherein the corrected set of data bits are stored in a third register.

10. The method of claim 9, wherein the symbol position index identifies a location in the second register to store the bit error mask.

11. An apparatus comprising:
a vector signal code receiver configured to generate a plurality of linear combinations of wire signals present on a plurality of wires to decode a predetermined number of sequentially received vector signaling codewords to obtain (i) sequential sets of data bits and (ii) two multi-bit error correction check words, wherein elements of each vector signaling codeword correspond to the wire signals and are received in parallel over the plurality of wires, each linear combination of the plurality of linear combinations defined by a respective sub-channel of a plurality of mutually orthogonal sub-channels;
a forward error correction (FEC) check circuit configured to:
generate an incremental update of two error correction syndrome values based on each sequential set of data bits according to a check matrix, wherein each bit of a first multi-bit error correction syndrome value of the two multi-bit error correction syndrome values is incrementally updated using bits from corresponding bit positions in the sequential sets of data bits; and
in response to decoding of a final vector signaling codeword of the predetermined number of received vector signaling codewords, perform a final incremental update of the two multi-bit error correction syndrome values, the final incremental update including bitwise-comparisons of each multi-bit error correction syndrome value to a respective multi-bit error correction check word of the two multi-bit error correction check words; and
an error correction circuit configured to select a set of data bits from the sequential sets of data bits according to a symbol position index determined from a combination of the two multi-bit error correction syndrome values, and to responsively alter the selected set of data bits according to a bit error mask corresponding to the first multi-bit error correction syndrome value of the two multi-bit error correction syndrome values.

12. The apparatus of claim 11, wherein the FEC check circuit is configured to generate the incremental updates of the two multi-bit error correction syndrome values by performing a logical XOR operation on a previously-stored multi-bit error correction syndrome value based on a given set of data bits of the sequential sets of data bits.

13. The apparatus of claim 11, wherein the two multi-bit error correction syndrome values are initialized to logic zero values.

14. The apparatus of claim 11, wherein the two multi-bit error correction syndrome values are initialized according to the two multi-bit error correction check words prior to the FEC check circuit generating the incremental updates of the two multi-bit error correction syndrome values.

15. The apparatus of claim 11, wherein the error correction circuit is configured to determine the symbol position index by forming a binary reciprocal of the first multi-bit error correction syndrome value and forming a modulo-reduced multiplication with a second multi-bit error correction syndrome value of the two error correction syndrome values.

16. The apparatus of claim 15, wherein the binary reciprocal is formed using a lookup table (LUT).

17. The apparatus of claim 11, wherein the FEC check circuit is configured to update the first multi-bit error correction syndrome value by performing a logical XOR function on the bits from corresponding bit positions in the sequential sets of data bits.

18. The apparatus of claim 11, wherein the error correction circuit is configured to alter the selected set of data bits by performing a bit-wise XOR of the selected set of data bits with the bit error mask to create a corrected set of data bits.

19. The apparatus of claim 18, wherein the error correction circuit comprises a first register configured to store the sequential sets of data bits, a second register configured to store the bit error mask, and a third register configured to store the corrected set of data bits.

20. The apparatus of claim 19, wherein the symbol position index identifies a location in the second register to store the bit error mask.

* * * * *